United States Patent
Carberry et al.

(10) Patent No.: US 6,529,040 B1
(45) Date of Patent: Mar. 4, 2003

(54) FPGA LOOKUP TABLE WITH SPEED READ DECODER

(75) Inventors: Richard A. Carberry, Los Gatos, CA (US); Steven P. Young, San Jose, CA (US); Trevor J. Bauer, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/566,052

(22) Filed: May 5, 2000

(51) Int. Cl.$^7$ ................. H03K 19/173; H03K 19/177
(52) U.S. Cl. .............. 326/40; 326/46; 365/189.02; 365/230.02; 365/230.06
(58) Field of Search ................ 326/40, 41, 46, 326/47, 49; 365/189.02, 189.05, 230.02, 230.06, 230.08

(56) References Cited

U.S. PATENT DOCUMENTS

| | | | |
|---|---|---|---|
| 4,750,155 A | | 6/1988 | Hsieh |
| 5,315,178 A | * | 5/1994 | Snider .................. 326/44 |
| 5,414,377 A | * | 5/1995 | Freidin ................. 326/41 |
| 5,764,564 A | | 6/1998 | Frake et al. |
| 5,852,365 A | * | 12/1998 | Tamba et al. .......... 326/49 |
| 5,889,413 A | | 3/1999 | Bauer |
| 5,914,616 A | | 6/1999 | Young et al. |
| 5,933,369 A | | 8/1999 | Johnson et al. |
| 6,121,797 A | * | 9/2000 | Song et al. ............ 326/113 |

OTHER PUBLICATIONS

"Virtex 2.5 V Field Programmable Gate Arrays Advance Product Specification" Jul. 13, 1999 available from Xilnx, Inc. located at 2100 Logic Drive, San Jose, CA 95124; pp. 1–71.

Ken'ichi Shimomura et al; "A 1–V 46–ns 16–Mb SOI–DRAM with Body Control Technique"; IEEE Journal of Solid State Circuits, vol. 32, No. 11; Nov. 1997; pp. 1712–1720.

S.M. Sze, "Physics of Semiconductor Devices"; Copyright 1981 by John Wiley & Sons, Inc.; pp. 431–448.

* cited by examiner

Primary Examiner—Daniel D. Chang
(74) Attorney, Agent, or Firm—Edel M. Young

(57) ABSTRACT

A fast, space-efficient lookup table (LUT) for programmable logic devices (PLDs) in which the write decoder, read decoder and memory block of the LUT are modified to improve performance while providing a highly efficient layout. Both the write decoder and the read decoder are controlled by LUT input signals, and data signals are transmitted directly to each memory circuit of the memory block (i.e., without passing through the write decoder). The read decoder includes a multiplexing circuit made up of a series of multiplexers that are directly controlled by the input signals received from the interconnect resources of the PLD. In one embodiment, a configurable logic block is provided with a single write decoder that is shared by a first LUT and a second LUT.

21 Claims, 18 Drawing Sheets

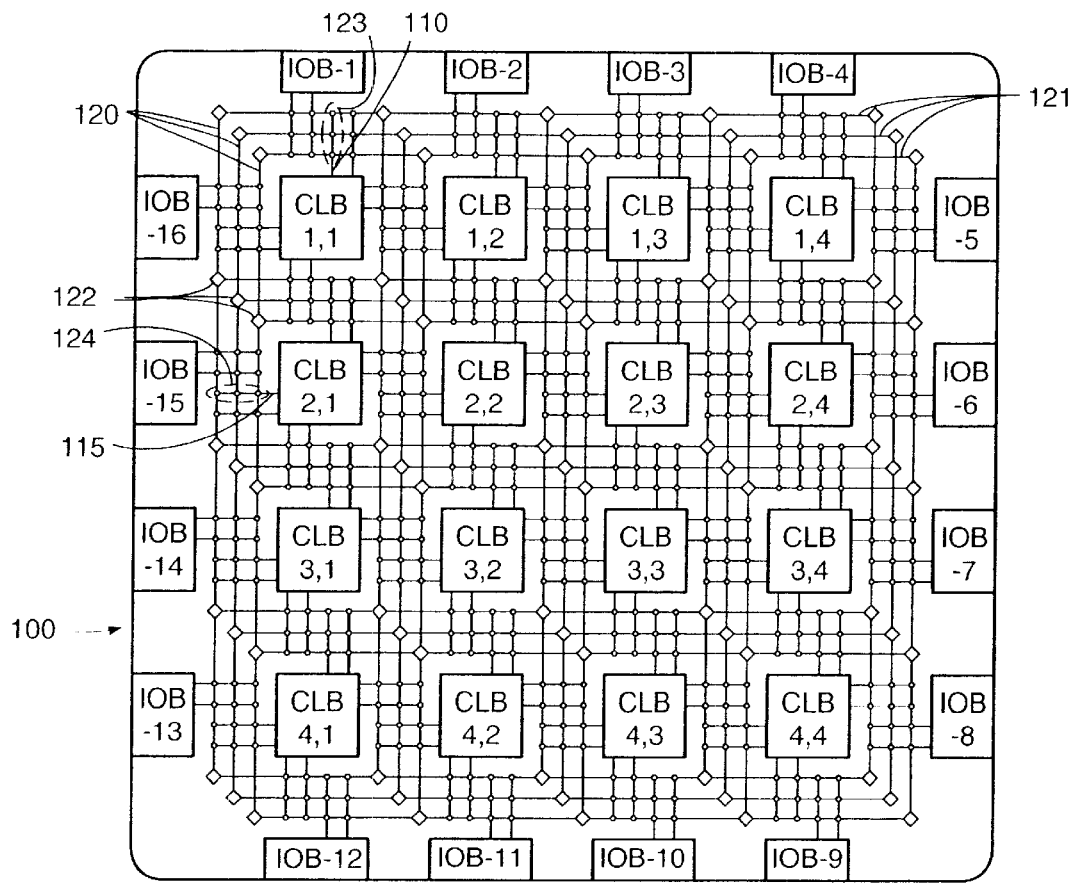
FIG. 1A (PRIOR ART)
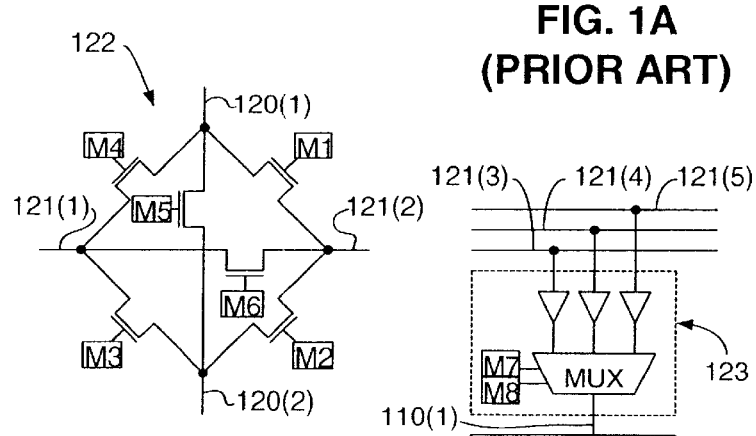
FIG. 1B (PRIOR ART)
FIG. 1C (PRIOR ART)
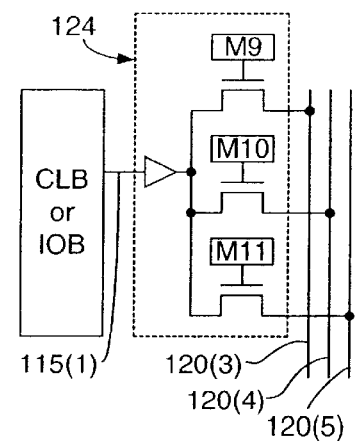
FIG. 1D (PRIOR ART)

FPGA LOOKUP TABLE WITH SPEED READ DECODER

FIELD OF THE INVENTION

The present invention relates to programmable logic devices, and more particularly to lookup tables utilized in programmable logic devices.

BACKGROUND OF THE INVENTION

FIG. 1A shows a basic Field Programmable Gate Array (FPGA) 100, which is a type of Programmable Logic Device (PLD). FPGA 100 includes an array of configurable logic blocks (CLBs) CLB-1,1 through CLB-4,4 that are surrounded by input/output blocks (IOBs) IOB-1 through IOB-16, and programmable interconnect resources that include vertical interconnect segments 120 and horizontal interconnect segments 121 extending between the rows and columns of CLBs and IOBs. Each CLB includes configurable combinational circuitry and optional output registers that are programmed to implement a portion of a user's logic function. The interconnect segments of the programmable interconnect resources are configured using various switches to generate signal paths between the CLBs that link the logic function portions. Each IOB is configured to selectively utilize an associated pin (not shown) of FPGA 100 either as a device input pin, a device output pin, or a bi-directional pin. Although greatly simplified, FPGA 100 is generally consistent with FPGAs that are produced, for example, by Xilinx, Inc. of San Jose, Calif.

FIGS. 1B through 1D show examples of the various switches associated with the programmable interconnect resources of FPGA 100. FIG. 1B shows an example of a six-way segment-to-segment switch 122 that selectively connects vertical wiring segments 120(1) and 120(2) and horizontal wiring segments 121(1) and 121(2) in accordance with configuration data stored in memory cells M1 through M6. Alternatively, if horizontal and vertical wiring segments 120 and 121 do not break at an intersection, a single transistor makes the connection. FIG. 1C shows an example of a segment-to-CLB/IOB input switch 123 that selectively connects an input wire 110(1) of a CLB or IOB to one or more interconnect wiring segments in accordance with configuration data stored in memory cells M7 and M8. FIG. 1D shows an example of a CLB/IOB-to-segment output switch 124 that selectively connects an output wire 115(1) of a CLB or IOB to one or more interconnect wiring segments in accordance with configuration data stored in memory cells M9 through M11.

Since the first FPGA was invented in 1984, variations on the basic FPGA circuitry have been devised that allow FPGAs to implement specialized functions more efficiently. For example, special interconnection lines have been added to allow adjacent CLBs to be connected at high speed and without taking up general interconnection lines. In addition, hardware has been placed between adjacent CLBs that allows fast carry signal transmissions when an FPGA is configured to implement an arithmetic function or certain wide logic functions. Finally, the circuitry associated with the CLBs has undergone several changes that allow each CLB to implement specialized functions more efficiently. Such CLB modifications are particularly relevant to the present invention.

FIG. 2 shows a CLB used in the Virtex™ series of FPGAs produced by Xilinx, Inc. (Virtex is a trademark of Xilinx, Inc., assignee of the present patent application.) The CLB includes two slices SLICE-0 and SLICE-1. Each slice includes a pair of four-input lookup tables (LUTs) LUT F and LUT G, a pair of registers FF-X and FF-Y, and additional arithmetic carry and control (CARRY & CNTRL) logic. The output signal from each LUT is programmably controlled such that it is either transmitted directly to the surrounding interconnect resources (not shown), or applied to the D input of an associated register. Additional information regarding registers FF-X and FF-Y and the carry and control circuitry of the CLB can be found in the "Virtex™ 2.5 V Field Programmable Gate Arrays Advance Product Specification", which was made available Mar. 13, 1999 on the World Wide Web at http://www.Xilinx.com/partinfo/virtex.pdf, and is incorporated herein by reference. A paper copy of this Mar. 13, 1999 document can be obtained from Xilinx, Inc., 2100 Logic Drive, San Jose, Calif. 95124.

FIG. 3A shows a lookup table (LUT) 300 that is used to implement LUT-G in the Virtex CLB shown in FIG. 2. LUT 300 includes a predecoder 310, a latch circuit 320, a write decoder 330, a memory block 340 and a read decoder 350. Input terminals IN1 through IN4 receive input signals from interconnect lines (see FIGS. 1A, 1C) of a host FPGA. These input signals are transmitted to predecoder 310, which generates an eight-bit address signal on read address lines R1 trough R8 in response to the input signals. Read address lines R1 through R8 transmit the address signal to read decoder 350. In addition, the read address lines R1 through R8 of one LUT (LUT-G in FIG. 2) are connected to latch circuit 320. Latch circuit 320 temporarily stores the eight bits of the address signal transmitted on read address lines R1 through R8, and applies the eight bits as a write address signal to write address lines W1 through W8. This write address signal is applied to write decoder 330, and is also transmitted to the write decoder of the second LUT of the Virtex™ CLB (i.e., LUT-F; see FIG. 2). In other devices, such as those in Xilinx's XC4000™ series of FPGAs, each LUT of a CLB has independent write address lines.

Memory block 340 includes sixteen memory circuits PMC-1 through PMC-16. As discussed below, each memory circuit PMC-1 through PMC-16 is capable of storing one data bit. Data bits are stored during configuration, and read during a read-back operation. During the configuration mode, data bits are transmitted to memory circuits PMC-1 through PMC-16 using address and data signals transmitted from a configuration bus (CONFIG BUS). During a memory write operation, data bits transmitted through a data-in DIN terminal are passed to memory cell input terminals QIN of selected memory circuits PMC-1 through PMC-16 by write decoder 330. Each data bit is passed to a selected QIN terminal based on the write address signal transmitted to write decoder 330 on write address lines W1 through W8. During subsequent memory read operations, data bits are transmitted from memory circuit output terminals QO of selected memory circuits to a LUT output terminal OUT by read decoder 350 in response to the read address signals transmitted on read address lines R1 through R8.

In addition to the configuration mode and memory read/write operations, LUT 300 can implement a shift register. During shift register operations, data bits are transmitted directly from the DIN terminal to the shift-in terminal SIN of memory circuit PMC-1, and then transmitted sequentially from the QO terminals of each memory circuit to the SIN terminals of a subsequent memory circuit. This shift register structure is further described by Bauer in U.S. Pat. No. 5,889,413, which is incorporated herein by reference.

FIGS. 3B through 3F show additional details of LUT 300. FIG. 3B shows relevant portions of predecoder 310. Predecoder 310 receives input signals on LUT input terminals IN1 through IN4. These input signals are inverted by first inverters 313, and are transmitted in non-inverted and inverted forms to NAND gates 315. NAND gates 315 generate output signals based on the logical NAND of selected pairs of the non-inverted or inverted input signals. These output signals are transmitted from NAND gates 315 to second inverters 317 which generate the eight read address signals R1 through R8.

FIG. 3C shows write decoder 330 of CLB 300. A data input signal DIN is passed to the QIN terminal of a memory cell PMC-1 through PMC-16 as selected by write address signals W1 through W8.

FIG. 3D shows read decoder 350 of LUT 300. Decoder 350 selects an output signal QO from one of memory cells PMC-1 through PMC-16 as selected by address signals R1 through R8 and places the selected signal on terminal OUT if configured to do so by multiplexer 358.

FIG. 3E shows memory circuits PMC-15 and PMC-16 of memory block 340 (see FIG. 3A). Memory circuits PMC-15 and PMC-16 are accessed by shift-in terminal SIN through a control transistor 342. CMOS transmission gate 343 is used to latch the memory cell output value while the memory cell itself is changing. This latching feature is particularly important during shift operations. (Signal PHI-1 goes low only briefly, as described by Johnson et al. in U.S. Pat. No. 5,933,369 entitled "RAM With Synchronous Write Port Using Dynamic Latches".

Cell 341 is a seven transistor ("7T") memory cell that includes a latch circuit 345, configuration transistors 346 and 347, and a feedback NMOS transistor 348. The advantage of using transistor 348 is described by Frake et al. in U.S. Pat. No. 5,764,564, incorporated herein by reference. Configuration transistors 346 and 347 are controlled by an address signal transmitted on address lines Al through A16 from the configuration bus (lines A15 and A16 shown).

Operation of LUT 300 will now be described with reference to FIGS. 3A through 3E. A high address signal turns on configuration transistors 346 and 347 to pass a data bit from configuration data terminals D and Db to latch circuit 345. After configuration, if the LUT has been configured as a RAM, data is written to memory circuits PMC-1 through PMC-16 from the DIN terminal (FIGS. 3C and 3E) using write decoder 330. To transmit a data bit to a selected memory circuit PMC-1 through PMC-16, the address of the selected memory circuit is transmitted via the PLD interconnect resources to LUT input terminals IN1 through IN4 (FIG. 3A). These input signals are transmitted to predecoder 310, which generates corresponding address signals that are stored in latch circuit 320. These latched address signals are transmitted via write address lines W1 through W8 to write decoder 330. Write-strobe control signal WS is subsequently pulsed high to pass the data bit through a selected write-strobe transistor to the QIN terminal of the selected memory circuit. Note that the data is passed through only one write-strobe transistor of write control circuit 339 because only one of the sixteen output terminals of secondary switch groups 335 through 338 is actively driven. Referring to FIG. 3E, the data bit passes from the DIN terminal to the Q terminal of the selected memory cell 341. The data bit is applied from the Q terminal to the gates of transistors P1 and N1 while ground disconnect transistor 348 is turned off, thereby causing the selected latch circuit 345 to store the data bit.

In contrast to memory write operations, shift register operations transmit data bits to memory circuits PMC-1 through PMC-16 without passing through write decoder 330. As shown in FIG. 3A, the DIN terminal of LUT 300 is connected to the shift-in (SIN) terminal of memory circuit PMC-1. Each memory circuit output terminal QO is connected to the shift-in terminal SIN of the next memory circuit. Referring to FIG. 3E, the data bit on the Q-15 output terminal of memory circuit PMC-15 is transmitted to the Q terminal of PMC-16 in response to the PHI-2 control signal, turning on transistor 342. During a subsequent cycle of the shift register operation, the stored data bit is then applied in an inverted form on the Qb terminal of cell 341 for transmission to a subsequent memory circuit. In all other operational modes, control transistor 342 is maintained in an off state by a low PHI-2 control signal to isolate the SIN terminal from the Q terminal of memory cell 341.

Referring again to FIG. 3A, memory read (and LUT) operations are performed by passing the data bit stored in a selected memory circuit PMC-1 through PMC-16 to LUT terminal OUT using read decoder 350. For example, to read a data bit from a selected memory circuit, an appropriate address is transmitted as a corresponding set of input signals via the PLD interconnect resources (not shown) to LUT input terminals IN1 through IN4. These input signals are transmitted to predecoder 310, which generates corresponding read address signals on read address lines R1 through R8 that are transmitted to read decoder 350. Referring to FIG. 3E, an inverted data bit stored in latch 345 is applied to the Qb terminal. During a memory read operation, this inverted data bit is transmitted from memory cell 341 through CMOS transmission gate 343, which is enabled (turned on) by the PHI-1 and PHI-1$b$ control signals, and inverter 344 to the output terminal Q-1 through Q-16 of the selected memory circuit. Turning now to FIG. 3D, the read address signals are applied from read address lines R1 through R8 to switch groups 351 through 354 and switches 355-1 through 355-4 to inverter 356, multiplexer 358 and inverter 359 to the LUT terminal OUT.

LUT 300 has proven extremely useful for implementing many logic functions. However, several features of LUT 300 produce operation and layout issues that are less than optimal.

First, as discussed above with reference to FIG. 3C, during a memory write operation, the incoming data signal transmitted from inverter 304 must pass through three pass transistors (gates) before it reaches the QIN terminal of a selected memory circuit PMC-1 through PMC-16. Two of these three gates are associated with the write decode process, and one gate is associated with write-strobe operations. This creates a problem in that the data signal that reaches the selected memory cell is relatively weak. To account for this weak signal, the clock driving memory circuits PMC-1 through PMC-16 must be relatively slow.

Another problem presented by write decoder 330 is that data bits are transmitted via a single terminal of memory circuits PMC-1 through PMC-16 during memory write operations (i.e., via the Q terminal). A second write decoder would be required to direct complementary data bits to a second terminal of the selected memory circuit (i.e., the Qb terminal). Likewise, data bits are transmitted only to the Q terminal of each memory cell during shift register operations, as indicated in FIG. 3E. The problem presented by writing to a memory cell using a single terminal is that if the data bit signal is not strong enough, then it may not be possible to reliably overpower the feedback inverter (i.e., P2 and N2) of the memory cell.

Turning off transistor 348 during writing assists memory cell 341 to flip properly, as discussed by Frake in U.S. Pat.

No. 5,764,564, but it doesn't guarantee proper operation since the voltage applied to the Q terminal may not cause the inverter comprising transistors P1 and N1 to flip the inverter comprising transistors P2 and N2, especially as technology moves to lower supply voltages. Moreover, several problems are created by adding feedback NMOS transistor 348 to memory cells 341 of memory circuits PMC-1 through PMC-16. First, the addition of feedback NMOS transistor 348 turns each memory cell 341 into a 7T memory cell, which is not required in any other part of the host PLD. As such, memory cells 341 are laid out and built differently from all other memory cells of the host PLD, so design changes are more complex than if a single memory cell were used throughout the host PLD. Second, because the physical layout of memory cells 341 differs from that of all other memory cells, gaps are required between memory cells 341 and the 6T memory cells of the host PLD. As a result, the layout of LUT 300 is inefficient in that it requires spaces separating memory cells 341 from other configuration memory cells.

What is needed is a LUT implementation in an FPGA PLD that overcomes the deficiencies of LUT 300, and does so in an area efficient manner.

SUMMARY OF THE INVENTION

The present invention is directed to a fast, area efficient lookup table (LUT) that is used as a function generator, a shift register, or a RAM in a programmable logic device (PLD). In accordance with the various aspects of the invention, the write decoder, read decoder and memory circuits of the LUT are modified to improve performance during memory read operations, while providing a highly area efficient layout arrangement that minimizes the overall layout area of the LUT.

Fast Write Data Path

In accordance with a first aspect of the present invention, a write decoder includes a plurality of logic gates that generate appropriate select signals during memory write operations in response to the input signals. For example, the logic gates generate sixteen select signals in response to four input signals, one of the sixteen select signals being asserted (e.g., high) in response to a corresponding sequence of input signals. These sixteen select signals allow data input signals to pass to the memory circuits through a minimum number of pass transistors.

Decoder Shared by LUT Pairs

In accordance with a second aspect of the present invention, associated LUT pairs share a common write decoder. Data signals are transmitted to each LUT of a pair from a separate source, and are directed to selected memory cells in response to the select signals. Because the common write decoder does not act as a decode tree to route data signals, the select signals can be shared by the two associated LUTs. Because two LUTs share a single write decoder, the overall layout size is reduced.

True and Complement Data Signals

In the prior art circuit of FIG. 3A using the write decode tree shown in FIG. 3C, it is not practical to drive the memory cells with both true and complement data input signals because separate write decode trees would be required for the true and complement data input signals. However, in accordance with a third aspect of the present invention, because the data input signal is not passed through a write decode tree before reaching a memory cell, both true and complement data signals can be transmitted to the memory cell circuit without requiring two separate write decode trees. Using both true and complement data input signals makes memory write operations more reliable and faster, and eliminates the need for a ground disconnect transistor. Moreover, the problem associated with the prior art write decoder of charge sharing between a memory cell node and a write decode node (could cause the memory cell to inadvertently flip) is eliminated because individual select signals are utilized to access each memory cell circuit.

Regular Write Decoder Layout

In accordance with a fourth aspect of the present invention, the logic gates utilized in the write decoder are fabricated using two rows of transistors (one row of P-channel transistors and one row of N-channel transistors). The logic gates are arranged to match the pitch of the memory cells in the memory block. For example, if four-input NOR gates are used to access memory cells formed by four transistors arranged in parallel, then the width of the four-input NOR gates matches the width of the memory cells. This arrangement minimizes the combined layout area of the write decoder and memory block because diffusions can be shared between the NOR gate transistors and the memory cell transistors. In addition, the regularity and compactness of the arrangement allows for a circuit having a given number of transistors to be formed in less layout area.

Further, because both true and complement data signals are applied to the memory cell, the ground disconnect transistor utilized in the prior art memory cell can be eliminated, thereby allowing the same six-transistor (6T) memory cell utilized in other portions of the PLD to be utilized by the memory circuits of a LUT. The use of 6T memory cells reduces the layout area of the LUT, and simplifies the fabrication process because the need to design and lay out seven-transistor (7T) memory cells is eliminated.

Feedback Pulls Up Output Signal

In accordance with a fifth aspect of the present invention, each memory circuit includes an output latching transistor and a feedback inverter circuit connected between the output latching transistor and a memory cell output terminal. The feedback inverter circuit enables the input terminal of the inverter to reach a fully high value in spite of being driven by an NMOS gate from the memory cell circuit. The feedback inverter circuit lays out in a more efficient manner because it shares diffusion with a PMOS transistor in the inverter. Further, replacing the CMOS switch with a relatively resistive single NMOS pass transistor reduces charge-sharing problems. In particular, this NMOS pass transistor is more resistive than a full CMOS transmission gate, reducing the effect on the related memory cell of charge potentially stored by the capacitance of the feedback inverter circuit. The charge sharing problem is further minimized by the presence of additional control transistors (used to pass true and complement data signals during memory write operations) to the memory cell output terminal, thereby increasing the capacitance on the memory circuit side of the NMOS pass gate relative to the input capacitance of the feedback inverter.

Multiplexer Buffered Mid-way

In accordance with a sixth aspect of the present invention, the read decoder is formed as a multi-stage multiplexer tree with inverters located between two stages of the tree, which buffer the signal and reduce signal delays during memory read operations. For example, in a three-stage multiplexer tree, the outputs of the second stage drive the inputs of the third stage through inverters. By placing the inverters between the second and third stages of multiplexers, these inverters allow the gates in the upstream 2-to-1 multiplexers to be much smaller and faster, and minimize the RC delay of the read decoder.

High Speed or High Function Output Option

In addition, an output control circuit is provided at the outputs of the last stage of multiplexers in the output multiplexer tree that includes programmable circuitry for selectively routing data either on a high speed output path or on a relatively slower high function path. Data transmitted on the high function output path passes through logic gates that receive signals from an adjacent circuit associated with, for example, arithmetic summing operations or wide function multiplexers.

BRIEF DESCRIPTION OF THE DRAWINGS

FIG. 1A shows a portion of a simplified prior art FPGA.

FIGS. 1B, 1C and 1D show switch circuits utilized to route signals in the FPGA of FIG. 1A.

DETAILED DESCRIPTION OF THE DRAWINGS

The present invention is directed to a fast, space-efficient lookup table (LUT) that is used as a function generator in programmable logic devices (PLDs). Although the circuit structures and layout arrangements associated with the present invention are described below with particular reference to FPGAs, some or all of the various aspects of the present invention may be beneficially utilized in other types of PLDs. Therefore, the appended claims are not limited to FPGAs.

Figure 2:
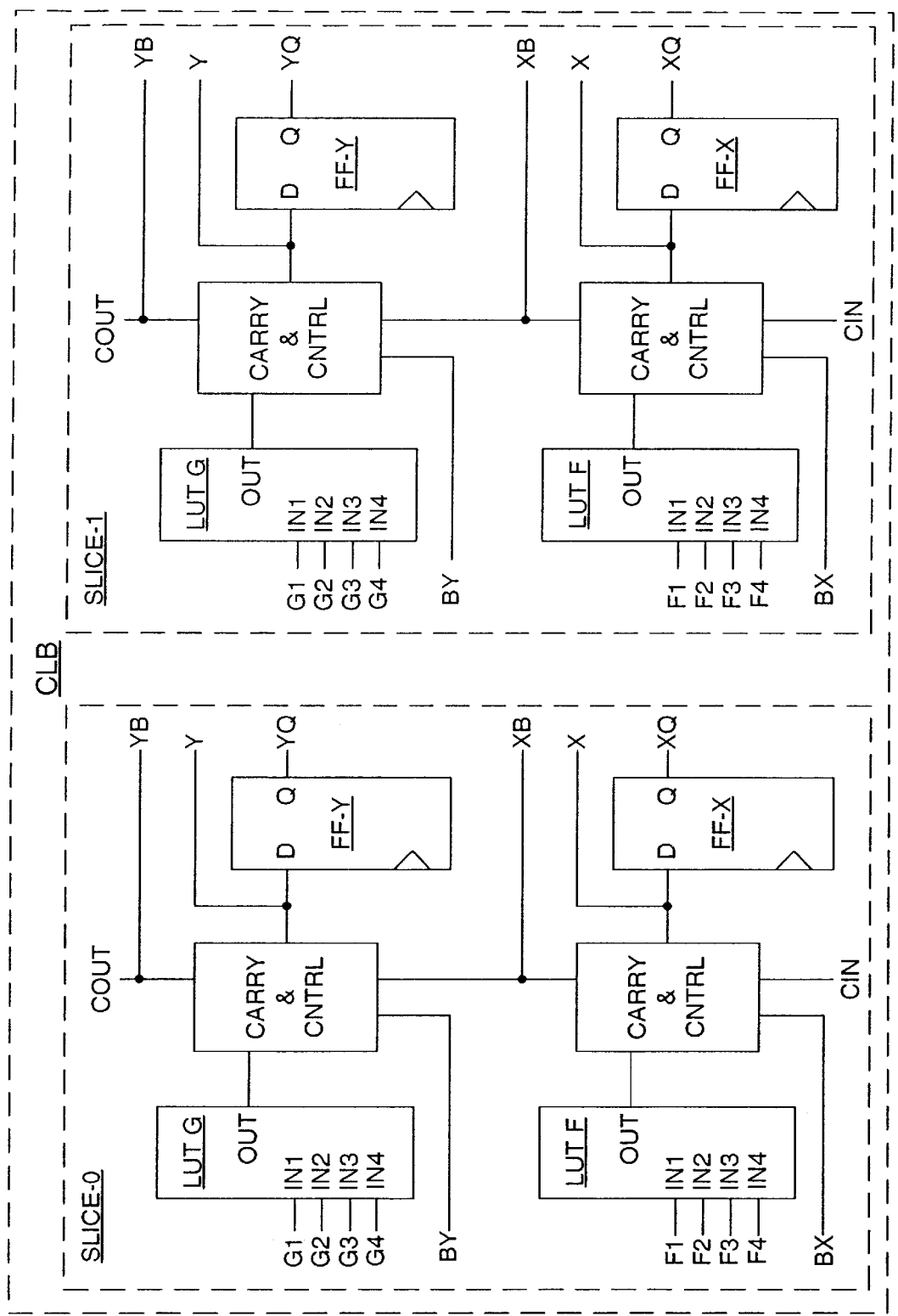
FIG. 2 shows the logic portion of a CLB of a prior art FPGA.
Figure 4:
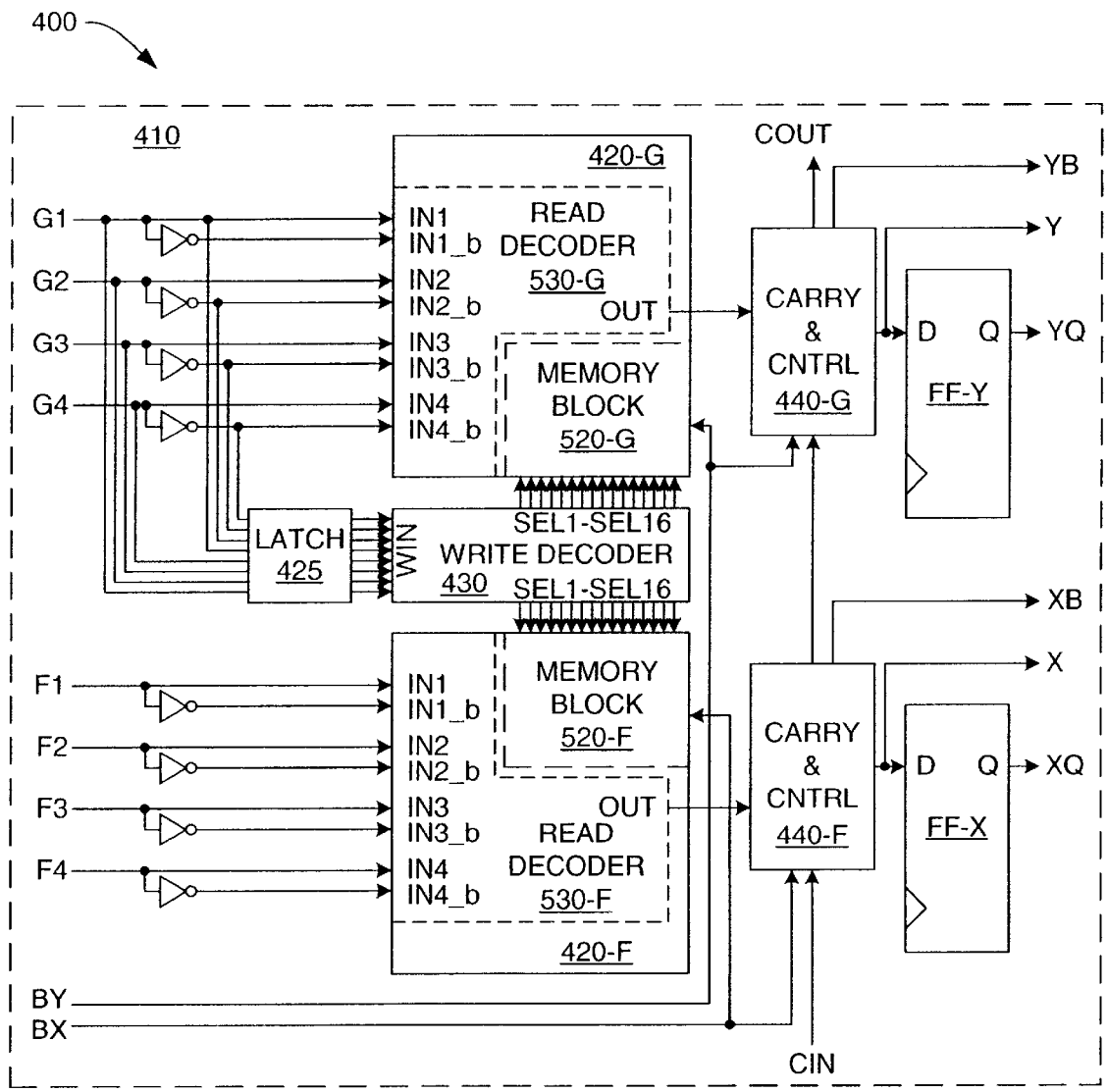
FIG. 4 shows one slice (half) of a CLB of an FPGA according to a first embodiment of the present invention.

FIG. 4 shows one slice 410 of a CLB 400 that incorporates the various novel aspects of the present invention in accordance with a first embodiment. CLB 400 is implemented in a host programmable logic device (PLD), such as FPGA 100 (see FIGS. 1A and 2). Each slice 410 includes a pair of four-input lookup tables (LUTs) LUT 420-F and LUT 420-G, a latch circuit 425, a write decoder 430, a pair of registers FF-X and FF-Y, and arithmetic carry and control (CARRY & CNTRL) circuits 440-F and 440-G. LUTs 420-F and 420-G and write decoder 430 are discussed in additional detail below. Latch 425, registers FF-X and FF-Y and carry and control (CARRY & CNTRL) circuits 440-F and 440-G of CLB 400 are substantially the same as that utilized in the Xilinx Virtex™ Family of FPGAs, and are described by Bauer et al. in U.S. Pat. No. 5,907,248, which is incorporated herein by reference.

Each LUT 420-F and 420-G includes a read decoder that receives four input signals that address one of sixteen memory cells of a memory block during memory read operations. For example, LUT 420-G includes a memory block 520-G, and a read decoder 530-G that receives four input signals G1 through G4 from the interconnect resources of the host FPGA. Input signals G1 through G4 are applied to input terminals IN1, IN2, IN3, and IN4, and are inverted and applied to input terminals IN1_b, IN2_b, IN3_b, and IN4_b of read decoder 530-G. A data bit transmitted from LUT 420-G is selectively combined with input signal BY or CIN in carry & control logic circuit 440-G and routed to any of a carry-out terminal COUT, a first output terminal Y, a second output terminal YB. The output signal on terminal Y can also be registered before being applied to the interconnect resources. See Young et al. U.S. Pat. No. 5,914,616 entitled "FPGA Repeatable Interconnect Structure with Hierarchical Interconnect Lines" (incorporated herein by reference) and particularly FIG. 6B of that patent for a description of a carry & control logic circuit for generating signals Y and YB.

As indicated in FIG. 4, the input signals transmitted to one of the LUTs (i.e., LUT 420-G) are routed to latch circuit 425. Specifically, in addition to being applied to input terminals IN1 through IN4 and IN1_b through IN4_b of LUT 420-G, input signals G1 through G4 (both true and complement) are transmitted to latch circuit 425. Latch circuit 425 temporarily stores these eight input signals and applies latched versions of these input signals as write address signals WIN to write decoder 430. In response to these eight latched input signals, write decoder 430 generates sixteen select signals SEL1 through SEL16 that are respectively applied to both LUTs 420-F and 420-G. Thus, in LUT 420-G, read decoder 530-G receives the same input signals as write decoder 430, with the only difference being that the write decoder signals are temporarily stored in latch circuit 425. However, LUT 420-F receives read address input signals on terminals IN1 through IN4 and IN1_b through IN4_b that are different from its write address input signals from write decoder 430.

Figure 5A:
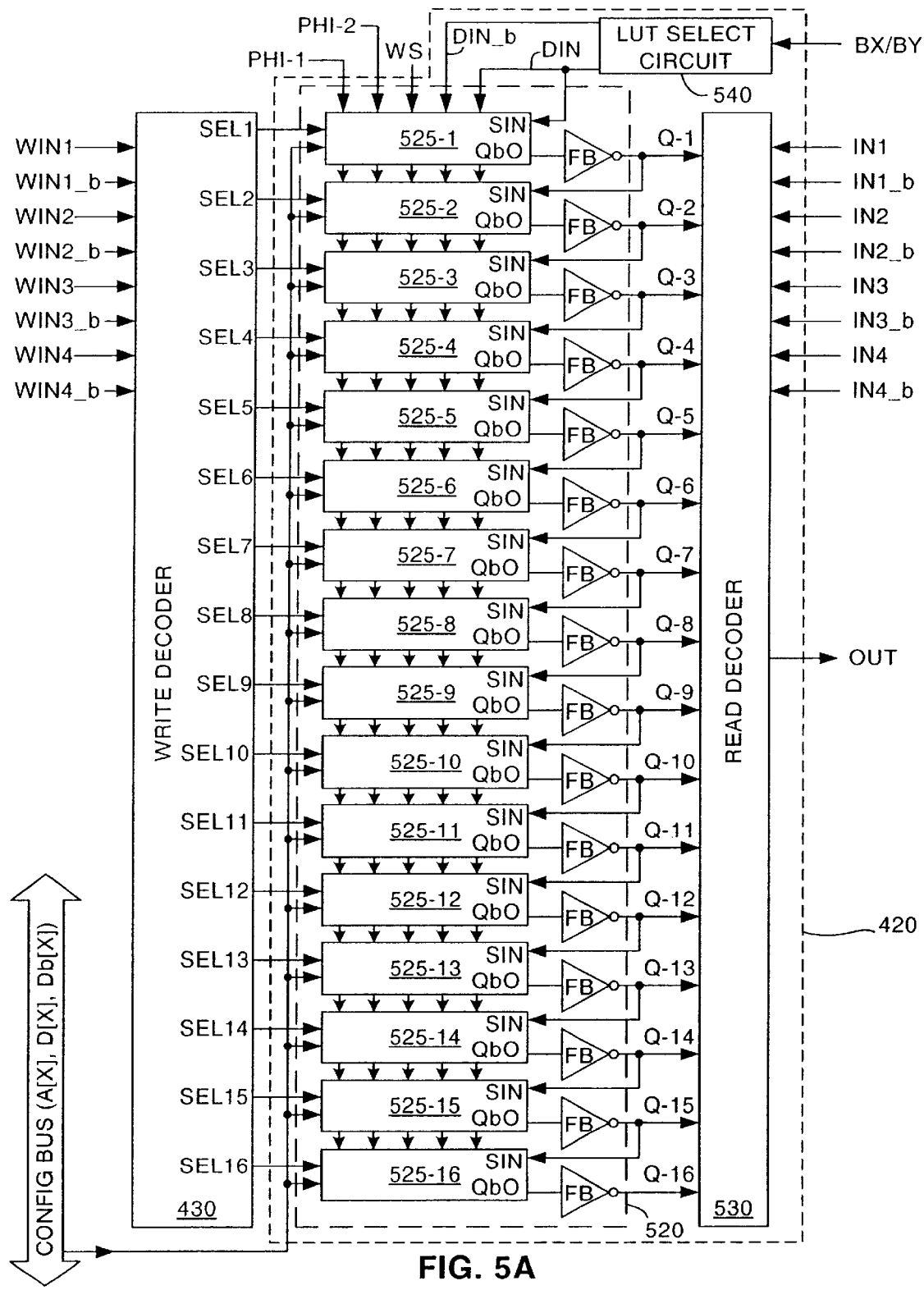
FIG. 5A shows a four-input LUT of the CLB slice shown in FIG. 4.

FIG. 5A shows a LUT 420 and write decoder 430. LUT 420 includes a memory block 520, a read decoder 530 and a LUT select circuit 540. Memory block 520 and read decoder 530 of LUT 420 are consistent with memory block 520-F and read decoder 530-F of LUT 420-F, and with memory block 520-G and read decoder 530-G of LUT 420-G of FIG. 4.

In accordance with one aspect of the present invention, both write decoder 430 and read decoder 530 of LUT 420 utilize the input signals received at input terminals IN1 through IN4 and IN1_b through IN4_b to address selected memory circuits. Read decoder 530 is directly connected (i.e., without an intervening pre-decode circuit) to input terminals IN1 through IN4 and IN1_b through IN4_b. This direct connection speeds up the memory read operation by allowing the input signals to pass directly to the multiplexing circuit of read decoder 530. Memory block 520 (FIG. 5A) includes sixteen independent memory circuits 525-1 through 525-16. Each memory circuit 525-1 through 525-16 stores one data bit. During the configuration mode, data bits are transmitted to memory circuits 525-1 through 525-16 via data lines D[X] and Db[X], and are stored in accordance with address information transmitted on address line A[X]. Note that data lines D[X] and Db[X] and address line A[X] are part of a configuration bus (CONFIG BUS) that is provided on a host PLD. Once configuration is concluded, if memory block 520 is configured as a RAM, during a memory write operation, inverted and non-inverted data signals are transmitted from data input terminals DIN and DINb to a selected memory circuit 525-1 through 525-16 in response to an associated select signal transmitted from terminals SEL1 through SEL16 of write decoder 430. Control signals PHI-1 and PHI-2, along with write-strobe signal WS, are also transmitted to each memory circuit 525-1 through 525-16, and are utilized in the manner described below.

Decoder Shared by LUT Pairs

In accordance with another aspect of the present invention, two or more LUTs (e.g., LUTs 420-F and LUT 420-G; see FIG. 4) receive select signals SEL1 through SEL16 from a common write decoder (e.g., write decoder 430). As shown in FIG. 5A, during memory write operations, data signals are transmitted from the DIN terminal directly to memory circuits 525-1 through 525-16. That is, the data signals are not routed through a decoder tree, as in prior art write decoder 330 (discussed above). By sharing a single write decoder (e.g., write decoder 530) between associated LUTs 420-F and 420-G (instead of separate write decoders for each LUT, as in the prior art), the overall layout of slice 410 and therefore CLB 400 (see FIG. 4) is efficient.

The data bits stored in memory circuits 525-1 through 525-16 are transmitted from memory output terminals QbO and feedback inverter circuits (FB) to memory output terminals Q-1 through Q-16.

In addition to configuration mode and memory read/write operations, each memory circuit 525-1 through 525-16 of memory block 520 is provided with special connections that allow the selective implementation of a shift register. In particular, each memory circuit 525-1 through 525-16 includes a shift-in terminal SIN. The SIN terminal of memory circuit 525-1 is connected to the DIN terminal. Output terminals Q-1 through Q-16 are connected to read decoder 530. Additionally, each output terminal is connected to the shift-in terminal SIN of an adjacent memory circuit 525-2 through 525-16. During shift register operations, data is transmitted directly from the DIN terminal to the SIN terminal of memory circuit 525-1. For buffering, the inverted data on the Qb output terminal of memory circuit 525-1 is transmitted through an inverter to the SIN terminal of a subsequent memory circuit (the shift register structure is described in detail by Bauer in U.S. Pat. No. 5,889,413).

Read decoder 530 passes the data from one of memory output terminals Q-1 through Q-16 to the LUT OUT terminal in response to the input signals received from input terminals IN1 through IN4 and IN1_b through IN4_b.

Figure 5B:
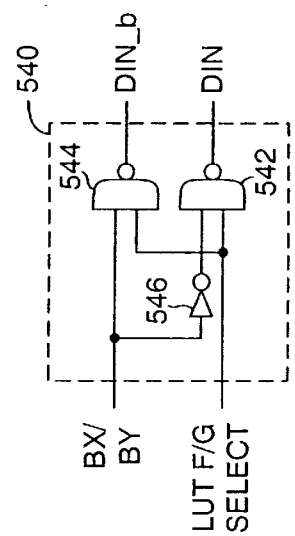
FIG. 5B shows a LUT select circuit that can be used in FIG. 5A.

FIG. 5B shows a well known circuit that can be used in a novel way for LUT select circuit 540. This circuit includes a first NAND gate 542, a second NAND gate 544 and an inverter 546, and generates true (DIN) and complement (DINb) versions of the input signal BX/BY when enabled by a high LUT F/G select signal. When not enabled, both DIN and DINb are high. Note that the memory cells 525-1 through 525-16 cannot be flipped unless one of input terminals DIN and DINb is low. This is because the voltage of the logic high signal is reduced by the threshold voltage of the N-channel access transistor and is therefore insufficient to override a zero volt low signal driven by a latch in the memory cell. Of course, during a write, one of the Q and Qb signals is logic zero, and remains at 0 volts when passed by the N-channel access transistor, thus a logic low signal is sufficient to overwrite a high signal from a latch in the memory cell. However, when both DIN and DINb are high, neither the Q terminal nor the Qb terminal of the memory cell cause the existing memory cell state to change.

Figure 6A:
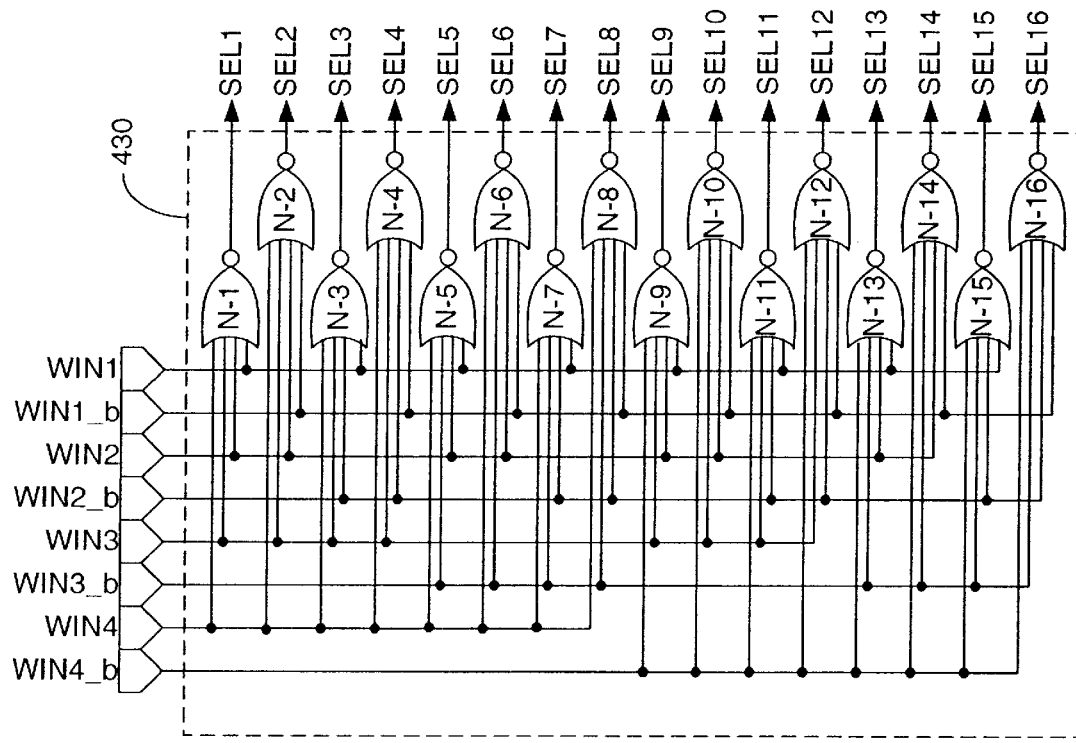
FIG. 6A shows a write decoder circuit of the LUT shown in FIG. 5A.

FIG. 6A is a schematic diagram showing a decoder circuit that can be used for write decoder 430 of CLB 420 (see FIGS. 4 and 5). The logic gates of write decoder 430 are implemented as four-input NOR gates N-1 through N-16, each receiving a different combination of input signals WIN1 through WIN4 and WIN1_b through WIN4_b. Each NOR gate N-1 through N-16 decodes a different combination of input signals. Therefore the sixteen select signals SEL1 through SEL16 can each select a corresponding memory circuit to receive the data-in signal, and passing data signals through a decode tree can be avoided.

Figure 7A:
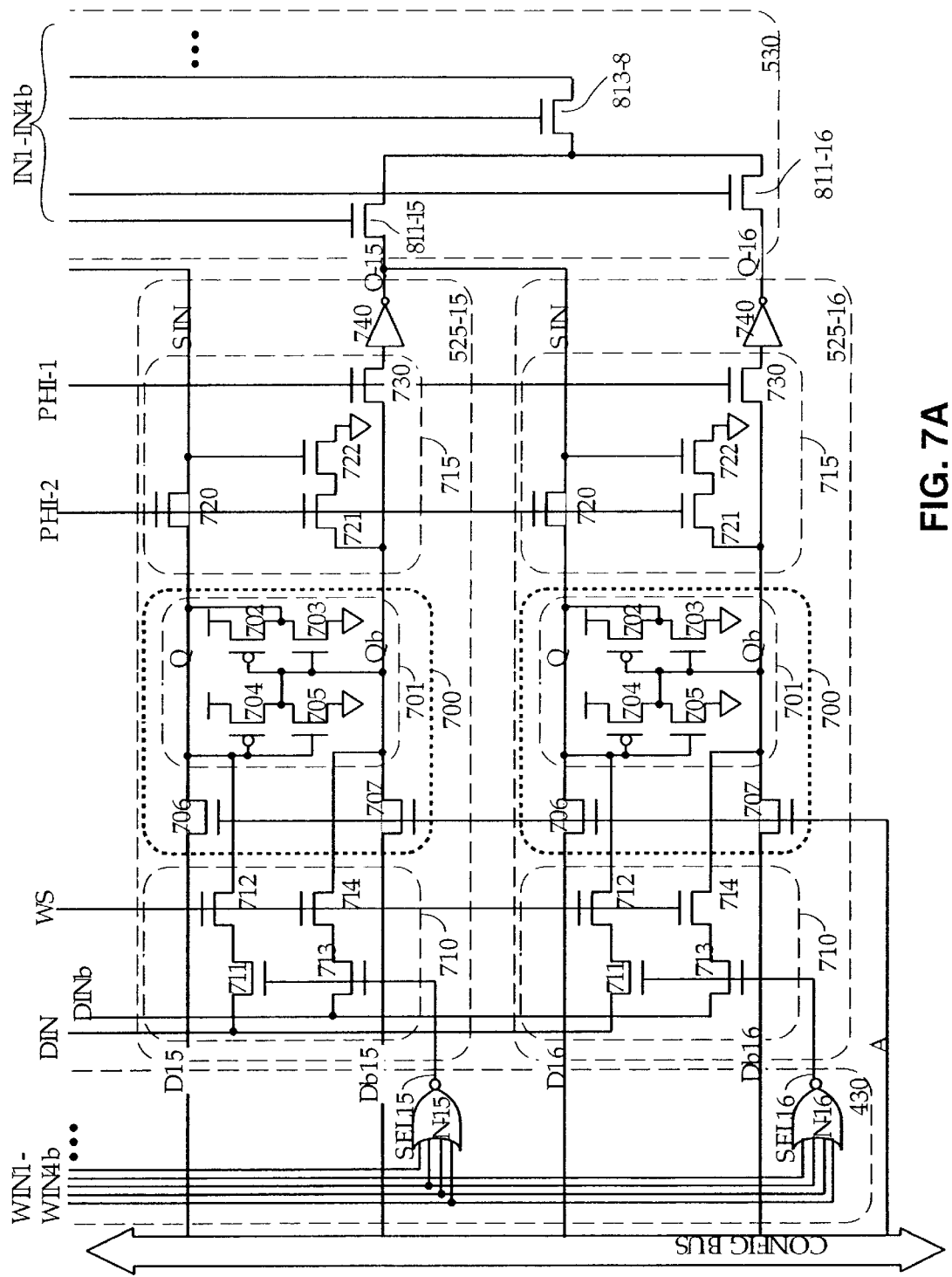
FIG. 7A shows two memory circuits used in the LUT shown in FIG. 5A.

As shown in FIG. 7A, memory circuits 525-1 through 525-16 (only two shown) are connected to the DIN terminal by select transistor 711 that is controlled by a corresponding select signal generated by write decoder 430. Specifically, select transistor 711 is turned on to pass a data bit directly from the DIN terminal through write strobe transistor 712 to memory cell 700 in response to a high select signal on select terminal SEL1 through SEL16 when the write-strobe signal WS pulses high. Advantageously, because the data is not passed through write decoder 430 (see FIG. 5A), both true and complement forms of the data signal can be transmitted to memory cell 700 without requiring a second write decode tree. Instead, the complementary (inverted) data signal is transmitted from the DINb terminal via select transistor 713 and through write-strobe transistor 714. As discussed in further detail below, both the true and the complement data signals are used to flip memory cell 700, thereby further increasing the robustness of memory write operations.

Efficient NOR Gate Layout

Figure 6B:
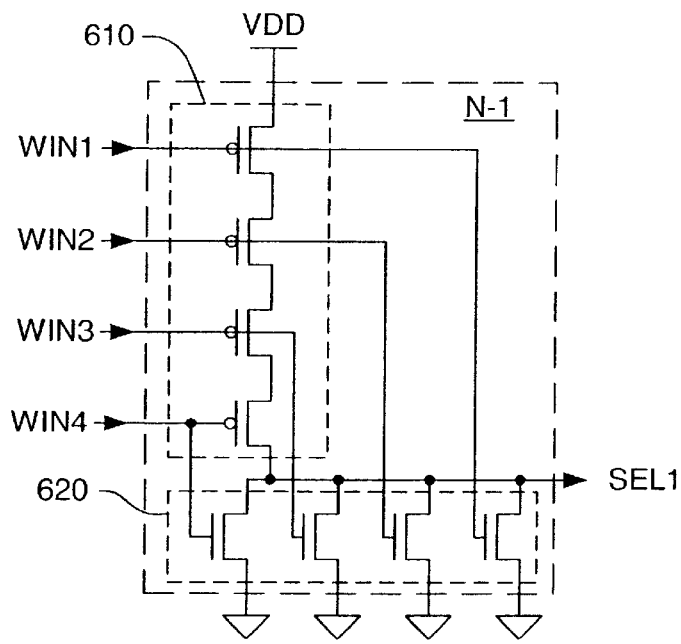
FIGS. 6B and 6C are a circuit diagram and a plan view, respectively, showing a NOR gate of the write decoder circuit shown in FIG. 6A.
Figure 6C:
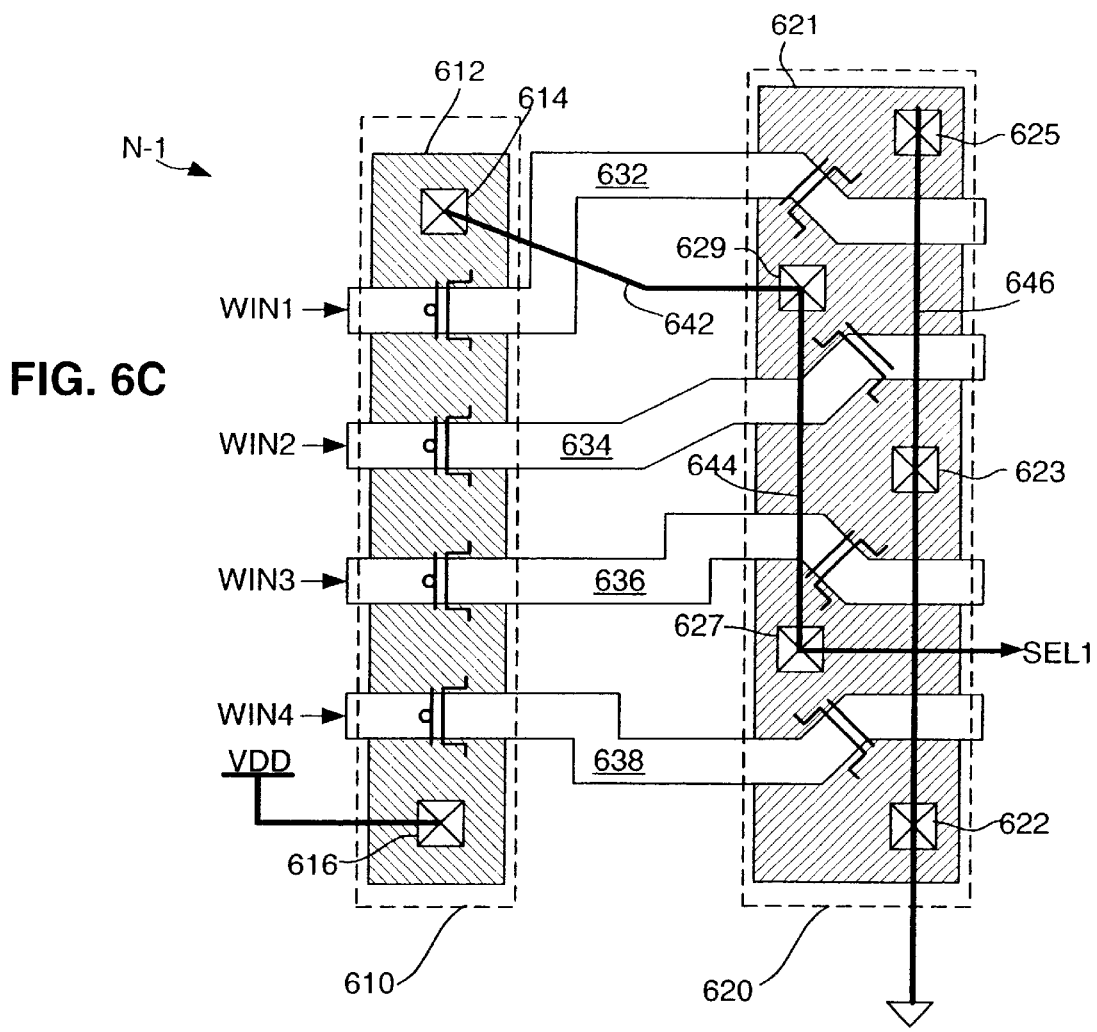

FIG. 6B shows a schematic of a well known 4-input NOR gate. FIG. 6C shows a preferred layout of the NOR gate of FIG. 6B. In the layout drawings of this patent application (FIGS. 6C, 7D, and 7E) the diffusion and poly regions are drawn approximately to scale but the metal lines are drawn symbolically and are not to scale.

As shown in FIG. 6C, NOR gate N-1 is fabricated with polysilicon structures 632, 634, 636 and 638 extending between a P-type diffusion region 612 and an N-type diffusion region 621, where P-type diffusion region 612 is formed in an N-well (not shown). Latched write input terminals WIN1 through WIN4 are applied to polysilicon structures 632, 634, 636 and 638, respectively. A first section of P-type diffusion region 612 is connected to Vdd by a contact point (metal via) 616, and a second section is connected to the select terminal SELL by contact point 614 and a metal line 642. P-type diffusion region 612 is separated into sections by channels formed under polysilicon structures 632, 634, 636 and 638, thereby forming series-connected P-channel transistors 610. Metal line 642 is also connected to a first section of N-type diffusion region 621 by a contact point 629, and to a second section via contact point 627. Surrounding sections are connected to ground via contact points 625, 623, and 622. The arrangement of alternating connections to power and ground forms parallel N-channel transistors 620. Thus, select line SELL is pulled to VDD only when all of WIN1 through WIN4 are low, and is pulled to ground when any of WIN1 through WIN4 are high.

Figure 3A:
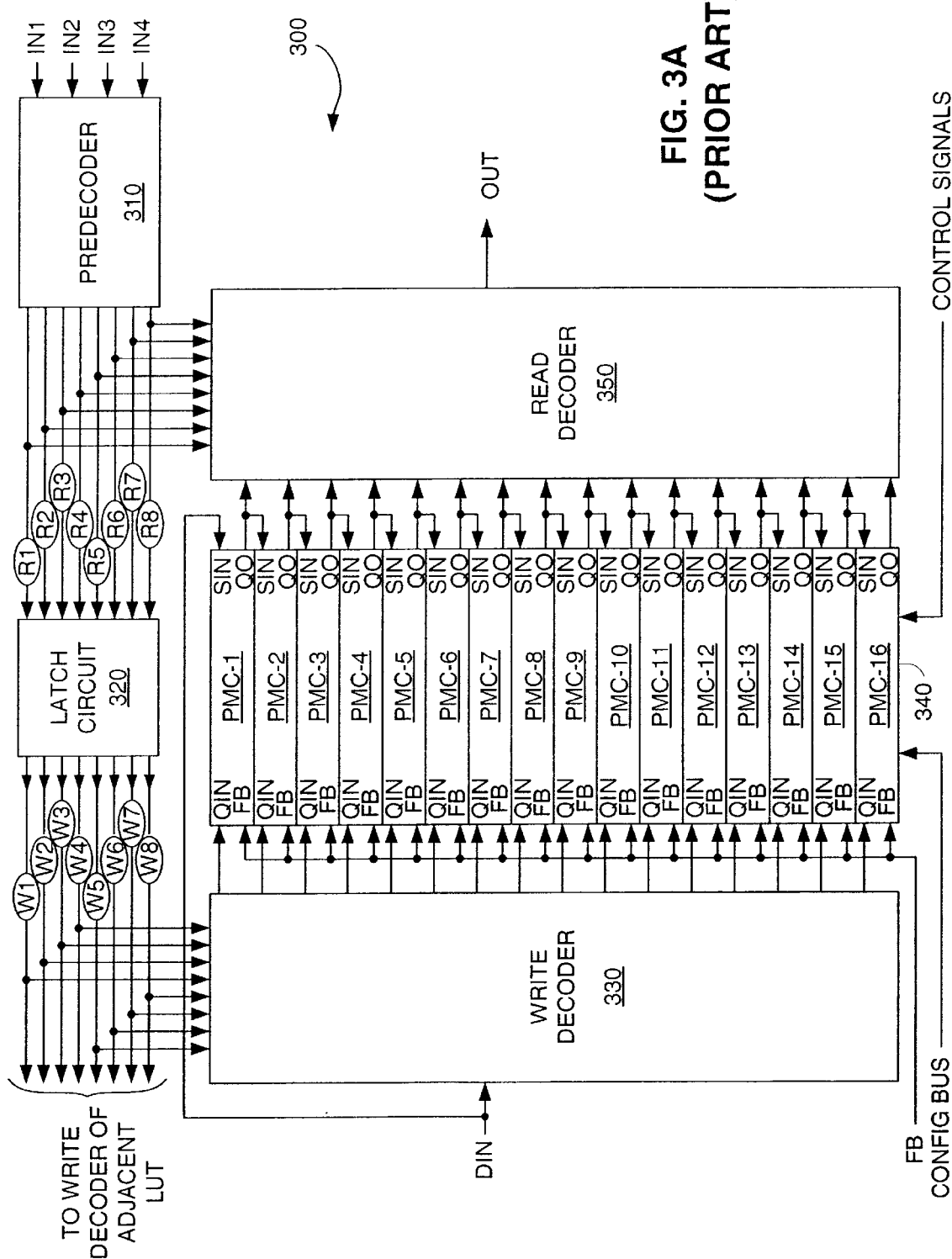
FIG. 3A shows a four-input LUT of the CLB shown in FIG. 2.
Figure 3B:
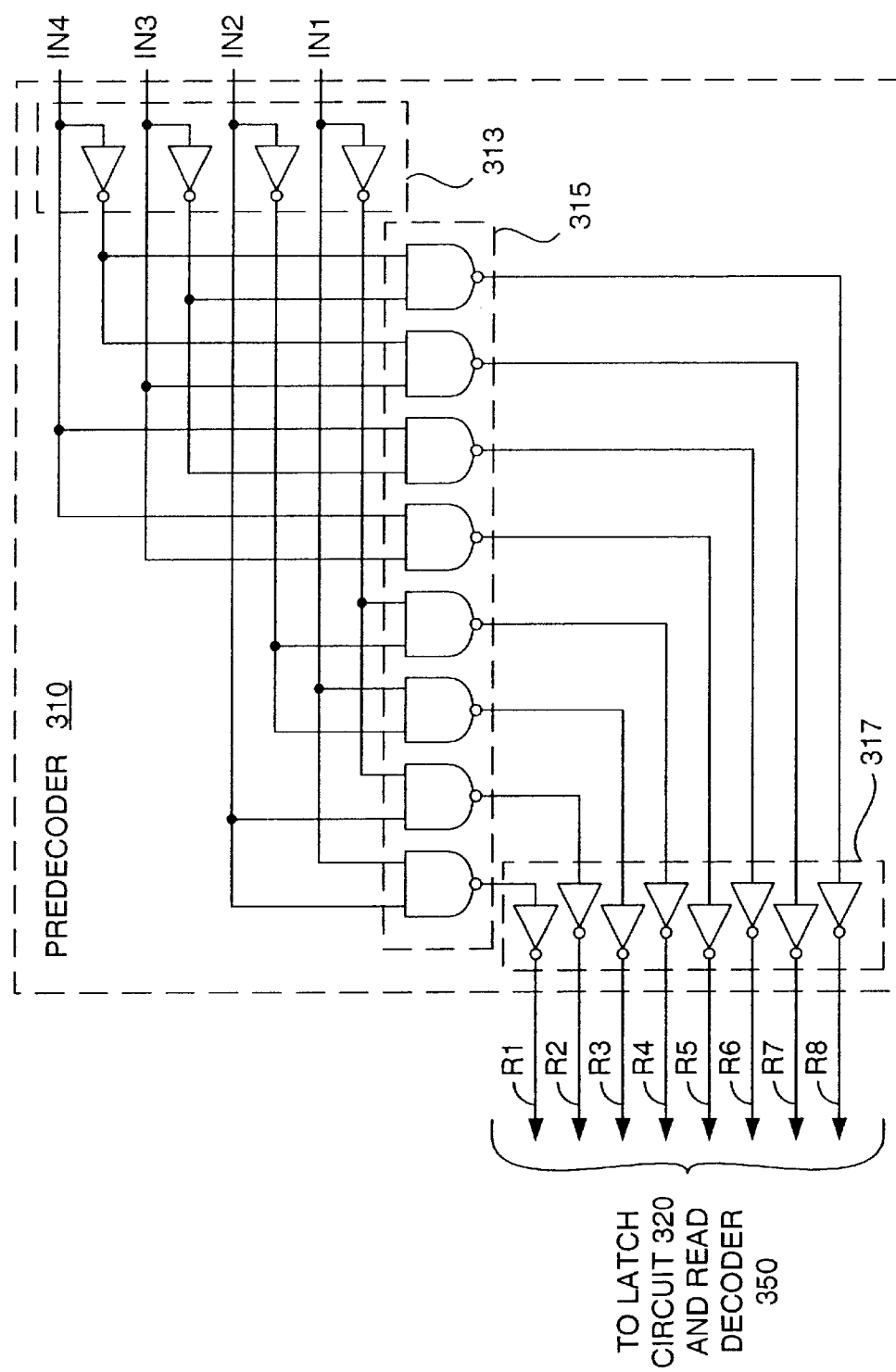
FIG. 3B shows a predecoder circuit of the LUT shown in FIG. 3A.
Figure 3C:
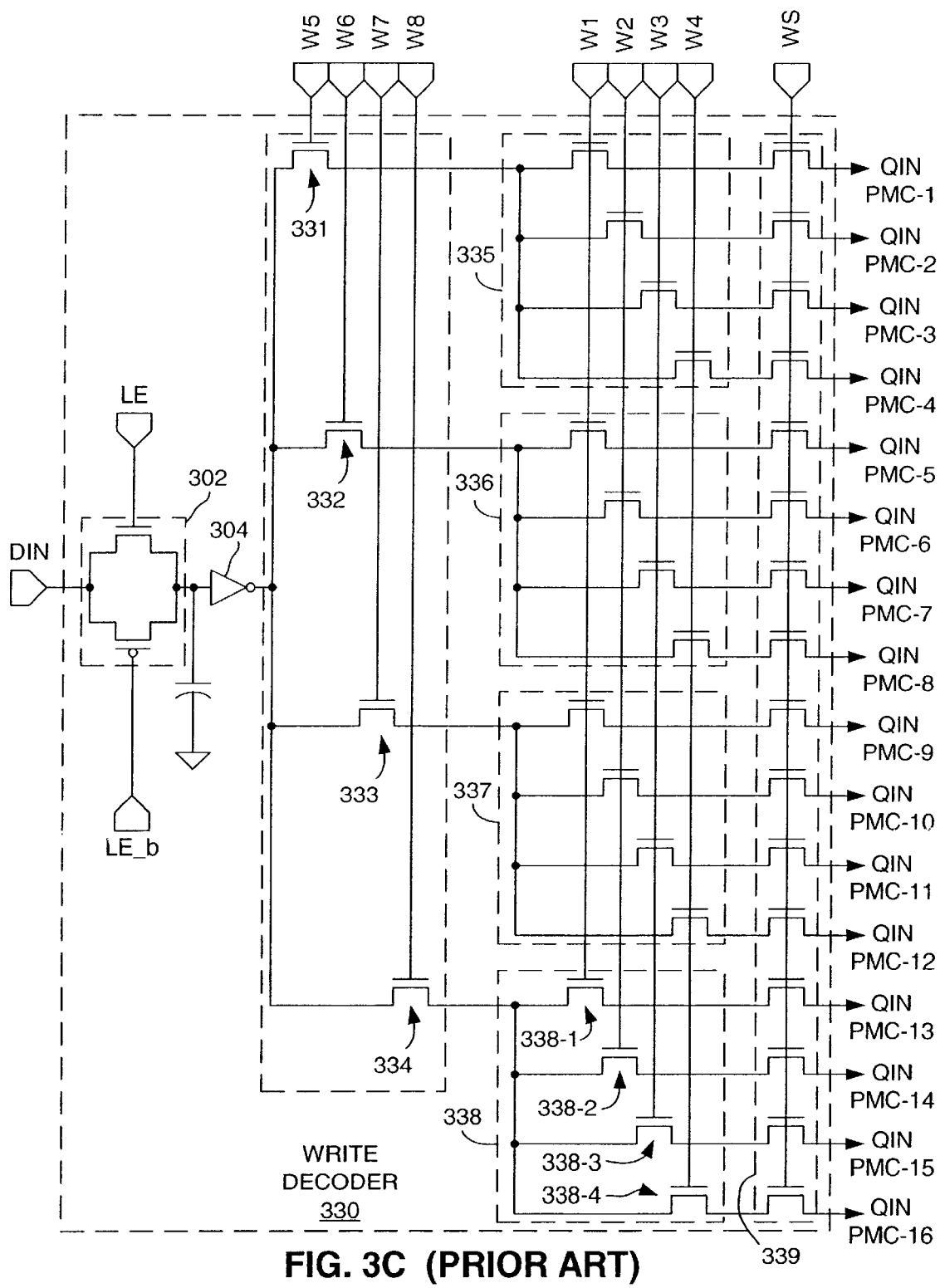
FIG. 3C shows a write decoder circuit of the LUT shown in FIG. 3A.

The pitch of these NOR gates matches the pitch of the LUT memory cells (discussed below), thereby providing a highly efficient layout arrangement. Therefore, even though write decoder 430 includes more transistors than prior art write decoder 330 (shown in FIG. 3C), the overall layout of write decoder 430 is, at worst, only slightly larger, thus costing very little to achieve the performance and robustness advantages discussed herein. Of course, other logic gates (such as NAND, AND or XOR) may be utilized in place of NOR gates N-1 through N-16. However, these other logic gates would not provide the area efficient layout provided by four-input NOR gates similar to that shown in FIG. 6C.

FIG. 7A shows memory circuits 525-1 through 525-16 (two shown) of FIG. 5A in more detail. Memory circuits 525-1 through 525-16 each include a memory cell 700 having Q and Qb terminals that are accessed three ways. During configuration, complementary data on data lines D1 and Db1 through D16 and Db16 in the configuration bus are applied in parallel to the Q and Qb terminals of each memory cell 700 in response to a high address signal A turning on transistors 706 and 707 in all memory circuits. (In another embodiment not shown, common data lines D and Db provide the data signal to all 16 lines D1 through D16, and 16 separate address lines A1 through A16 select one of the memory cells to receive the data. Thus the 16 memory cells are loaded in series.)

For RAM access, memory circuits 525-1 through 525-16 each include RAM access circuit 710 made up of select transistors 711 and 713, and write-strobe transistors 712 and 714. Select transistors 711 and 713 determine which of the 16 memory cells receives the data, and write strobe transistors 712 and 714 synchronize the writing. During RAM-mode write operations, the PHI-1 control signal is high (e.g. Vdd) (to make the newly written data immediately available to read decoder 530), and the PHI-2 control signal is low (e.g. 0 volts) (to isolate the cell terminals Q and Qb of memory cell 700 from the shift-in terminal SIN). The WS signal is brought high (e.g., Vdd) to turn on transistors 712 and 714, thereby allowing the passage of data from the data terminals DIN and DINb to cell 700.

Shift Register Operation

The structure of FIG. 7A can also operate as a shift register. For shift-register access, circuit 715 includes shift-register transistors 720, 721, 722, and 730. Shift register control transistors 721 and 722 are connected in series between ground (0 volts) and the Qb terminal of memory cell 700. Shift register control transistor 721 is controlled by the PHI-2 control signal, and shift register control transistor 722 is controlled by the data signal applied to the SIN terminal. Thus, at the rising edge of PHI-2, when SIN is high, transistor 722 is on and the high SIN signal is applied to Q while a ground signal is applied to Qb. When SIN is low, the low SIN signal is applied to Q and no pullup is applied to Qb. As discussed above, it is the zero volt signal that primarily controls the switching of the memory cell. Circuit 715 assures reliable switching in both states because circuit 715 assures that a zero volt signal is applied to one terminal of memory cell 700.

For reading and shifting, an output latching transistor 730 and a feedback inverter circuit 740 are connected in series between latch terminal Qb and the respective memory output terminal Q-1 through Q-16. Output latching transistor 730 is controlled by the PHI-1 control signal. The PHI-1 and PHI-2 control signals are generated as described by Bauer in co-owned U.S. Pat. No. 5,889,413, which is incorporated herein by reference. The PHI-1 control signal is never low long enough to risk losing a value on QbO due to leakage.

Charge Sharing

Note that during RAM write operations, select transistor 711 and write-strobe transistor 712 form a two-gate access structure between the DIN terminal and the latch terminal Q of memory cell 700. Similarly, select transistor 713 and write-strobe transistor 714 form a two-gate access structure between the DINb terminal and the latch terminal Qb of memory cell 700. When the WS signal pulses high and the select signal SELL through SEL16 is low, the only charge-sharing problem associated with the write operation exists between nodes separated by transistor 712 or transistor 714. Specifically, the only points for charge to accumulate are between data input control transistor 711 and write-strobe transistor 712, and between data input control transistor 713 and write-strobe transistor 714. Because transistors 711, 712, 713 and 714 are formed in a diffusion region that is shared with an associated NOR gate N-1 through N-15, capacitance is minimal. This is an improvement over the prior art decode tree structure, in which charge is stored throughout the tree. The potential charge sharing problem associated with prior art write decoder 330 (see FIG. 3C) is essentially eliminated by the present invention.

RAM Reading

During memory read operations, the WS and PHI-2 control signals are low (e.g., 0 volts), thereby turning off transistors 712, 714, 721 and 720 to isolate cell terminals Q and Qb of memory cell 700 from data input terminals DIN and DINb and shift-in terminal SIN. Conversely, the PHI-1 signal is high (e.g., Vdd) to turn on output latching transistor 730, thereby enabling the data value present at the inverted cell terminal Qb to pass from terminal Qb of a memory circuit 525-1 through 525-16 to the input terminal of associated feedback inverter 740.

Memory cell 700 includes a latch circuit 701 and configuration transistors 706 and 707. Memory cell 700 is constructed using the same 6T memory cell structure that is utilized in other portions of the FPGA. Because the same 6T memory cell is used throughout the host FPGA, the design process is simplified because design changes to the memory cells can be applied globally.

Feedback Inverters

Figure 7B:
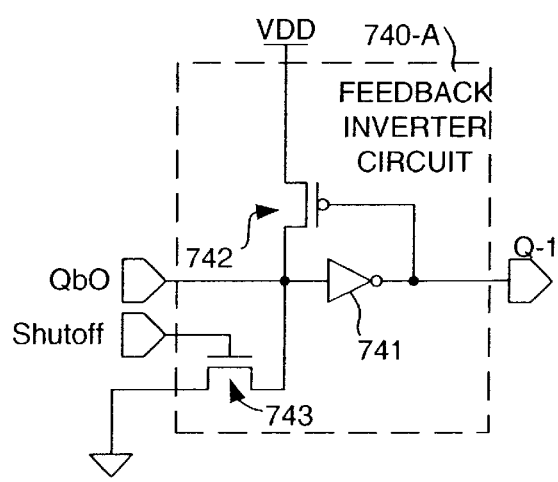
FIGS. 7B and 7C show alternative feedback inverter circuits of the memory circuit shown in FIG. 7A.
Figure 7C:
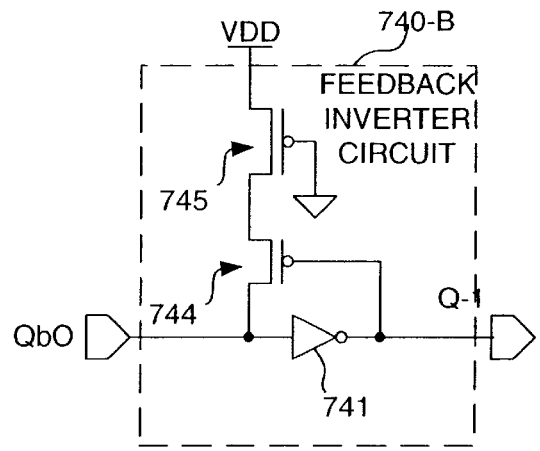

FIGS. 7B and 7C show alternative implementations 740-A and 740-B of feedback inverter 740 of FIG. 7A. In addition, feedback inverters 740-A and 740-B are representative of feedback inverters utilized in read decoders 530-A and 530-B, discussed below.

Feedback inverter circuit 740-A includes an inverter 741 having an input terminal connected to the QbO terminal of output latching transistor 730 (see FIG. 7A) and an output terminal connected the Q-1 terminal, and also includes a feedback transistor 742 having a first terminal connected to Vdd, a second terminal connected to the input terminal of inverter 741, and a gate connected to the output terminal of inverter 741.

In accordance with another aspect of the present invention, feedback inverter circuit 740-A biases the input terminal of inverter 741 to ensure that the input terminal can reach a fully high value (i.e., Vdd when the output terminal is 0 volts). Unlike prior art memory circuit PMC-1 (see FIG. 3E), feedback inverter circuit 740-A accomplishes this task without using CMOS transmission gate 343, and in particular without using the PMOS1 transistor. That is, the PMOS1 transistor of CMOS transmission gate 343 is replaced with feedback P-channel transistor 742, which lays out in a more efficient manner because it can share diffusion with a P-channel transistor that is already present in inverter 741.

Further, the charge sharing problem of the prior art memory circuit (in which the capacitance of a full transmission gate might flip the adjacent memory cell when the PHI-1 signal goes high) is minimized by replacing CMOS transmission gate 343 of prior art memory circuit PMC-1 with NMOS output latching transistor 730 because NMOS transistor 730 resists the passage of high signals and also has less capacitance. Since write-strobe transistor 714 and shift register control transistor 721 are connected to the Qb output terminal, there is increased capacitance on the terminal of NMOS transistor 730. Feedback transistor 742 pulls the input terminal of inverter 741 high quickly and also increases layout density compared to using transmission gate 343, while addressing the charge sharing problem.

FIG. 7C shows feedback inverter 740-B. Feedback inverter 740-B differs from feedback inverter 740-A (see FIG. 7B) in that it includes feedback transistor 744 in series with transistor 745. Feedback transistor 744 is a relatively strong transistor having a first terminal connected to feedback transistor 745, a second terminal connected to the input terminal of inverter 741, and a gate connected to the output terminal of inverter 741. Transistor 745 is a relatively weak transistor having a first terminal connected to Vdd, a second terminal connected to the first terminal of feedback transistor 744, and a gate connected to ground. Transistor 745 acts as a resistor that allows strong feedback transistor 744 to have a relatively shorter length, and therefore less capacitance, than that of feedback transistor 742 used in feedback inverter 740-A. Strong feedback transistor 744 minimizes the load on inverter 741, thereby allowing inverter 741 to be relatively smaller (weaker) and increasing signal propagation speed.

An alternative embodiment not shown combines inverter 743 of FIG. 7B with the pair of transistors 744 and 745 of FIG. 7C.

Leakage Current

In the present embodiment, inverter 741 is constructed using known techniques. When transistors are manufactured using very small sizes with corresponding low supply voltages, for example 0.15 micron channel lengths, the transistors of an inverter such as 741 can tend to leak. To avoid undesirable power drain due to leakage current from unused transistors, as shown in FIG. 7B, a shutoff transistor 743 is connected between the input terminal of inverter 741 and ground. In FIG. 7B, a high shutoff signal forces Q1 high, and a high Q1 signal forces the P-channel transistor of the next stage off, so that a leaky N-channel pull-down transistor can be used without producing a path from power to ground.

Efficient Layout of Memory Cell

Figure 7D:
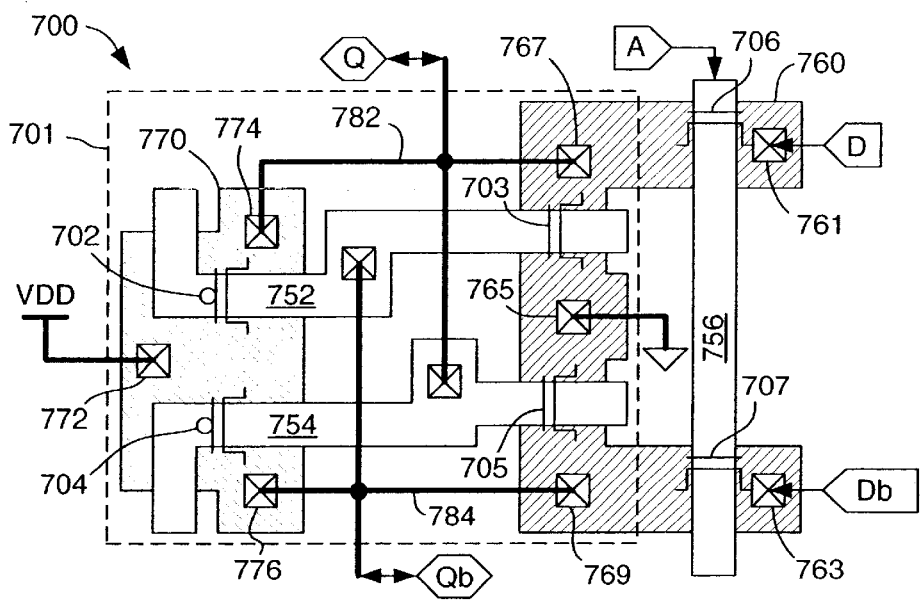
FIG. 7D shows a plan view of memory circuit 700 shown in FIG. 7A.

FIG. 7D is a plan view showing the layout of 6T memory cell 700. Memory cell 700 is fabricated with polysilicon structures 752 and 754 extending between an N-type diffusion region 760 and a P-type diffusion region 770. N-type diffusion 760 is generally in the shape of the letter C and is divided into five sections by the polysilicon structures 752, 754, and 756. P-type diffusion 770 is generally rectangular is divided into three sections by two of the polysilicon structures 752 and 754. A Vdd connection is made to the middle section of P-type diffusion 770 and a ground connection is made to the center section of N-type diffusion 760. End sections of diffusion 760 are connected at contact points 761 and 763 to data terminals D and Db. Second and fourth sections (around the C) are connected at contacts. 767 and 769 to the Q and Qb terminals. End sections of P-type diffusion 770 are connected at contact points 774 and 776 to the Q and Qb terminals. One of polysilicon gates 752 and 754 is connected to Q and the other to Qb. Thus 6T memory cell 700 is implemented. Transistors 702–707 of FIG. 7A are correspondingly shown and labeled in FIG. 7D. Because of the shared use of diffusion by Vdd and ground connections and the adjacent positions of several transistors, the structure is compact and efficient.

Efficient Layout of Access Circuit

To match the pitch of the access circuit to that of the memory cell and NOR gates, the N-channel control transistors of access circuits 710 in memory circuits 525-1 through 525-16 are fabricated in four-row columns that are aligned with the four N-channel transistors 620 of NOR gates N–1 through N–16 (see FIGS. 6B and 6C), thereby forming a highly area-efficient layout.

Figure 7E:
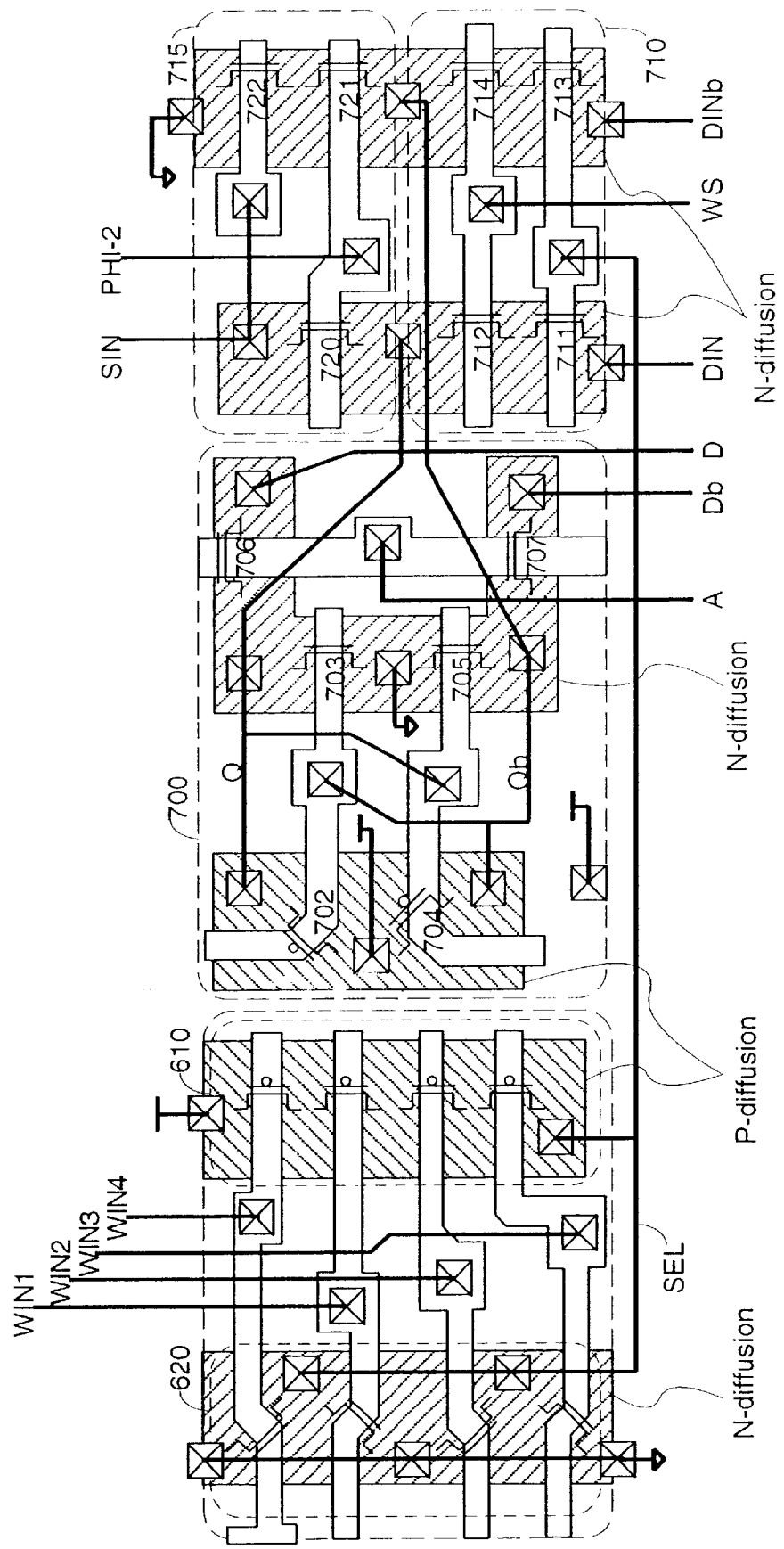
FIG. 7E shows a plan view combining of one NOR gates N–1 through N–16, access circuit 710, and memory cell 700 of FIG. 7A.

As shown in FIG. 7E, the N-channel transistors of access circuit 710 (see FIG. 7A) are efficiently formed adjacent to the layout arrangement of memory cell 700 (shown in FIG. 7D). The P-diffusion of NOR-gate region 610 is adjacent the P-diffusion of memory cell 700, thus saving area by minimizing the number of changes from N-diffusion to P-diffusion. Transistors 713, 714, 721 and 722 (also FIG. 7A) are arranged in a four-wide pitch that shares a common diffusion. Similarly, transistors 711, 712 and 720 also share diffusion in an area-efficient manner (the source of one transistor feeds the drain of the next). Because all of the transistors of access circuit 710 are N-channel transistors, the only P devices of memory circuit 525-1 are in memory cell 700 and in feedback inverter circuit 740. Therefore, the need for gaps between read decoder 530 and memory block 520 that is required in the prior art is minimized.

Read Decoder

Figure 8:
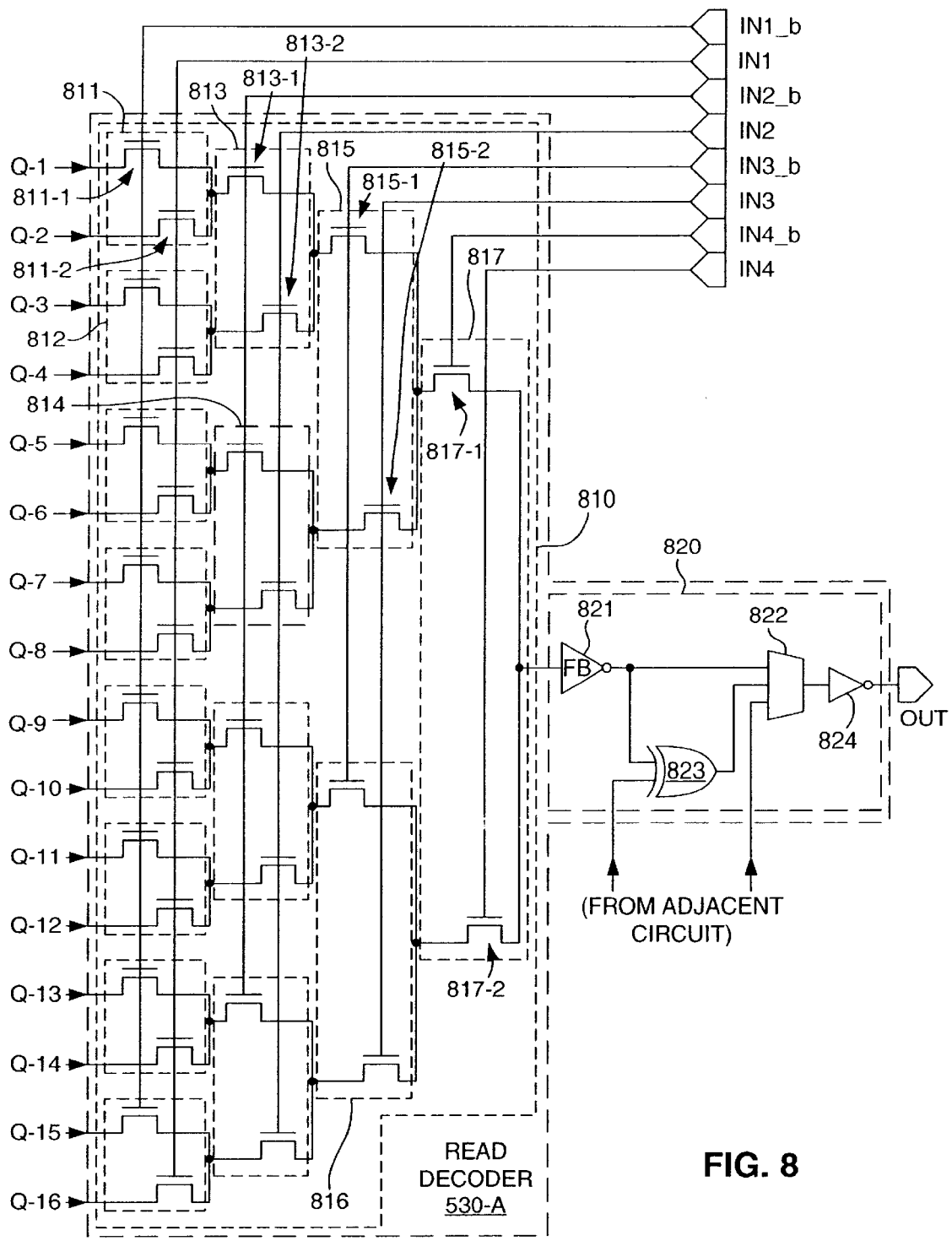
FIG. 8 shows a read decoder circuit of the LUT shown in FIG. 5A in accordance with a first variation of the present invention.

FIGS. 8 and 9 show alternative read decoders 530-A and 530-B for implementing read decoders 530-F and 530-G of LUT 400.

Read decoder 530-A includes a multiplexing circuit 810 and an output control circuit 820. In accordance with another aspect of the present invention, multiplexing circuit 810 includes a series of 2-to-1 multiplexers controlled by input signals received directly from input terminals IN1 through IN4 and IN1_b through IN4_b.

The series of 2-to-1 multiplexers in multiplexing circuit 810 are generally shown in columns, with each column of multiplexers being controlled by one of the four input signals.

The four columns of 2-to-1 multiplexers provide a 16-to-1 multiplexing function in which a data bit transmitted from memory block 520 passes through four 2-to-1 multiplexers (i.e., four pass transistors) before reaching output control circuit 820. By passing data signals through four 2-to-1 multiplexers, the total resistance through multiplexing circuit 810 is equal to the resistance from four pass transistors in series. By way of comparison, prior art read decoder 350 (see FIG. 3D) passes data bits through two 4-to-1 multiplexers, so the total resistance in prior art read decoder 350 is from two pass transistors. However, in multiplexing circuit 810 there are only two pass transistors connected to the output terminal of each 2-to-1 multiplexer (instead of four, as in prior art read decoder 350), so the total capacitance at each level is reduced. Therefore, the tradeoff of using four 2-to-1 multiplexers is higher resistance for lower capacitance at each node, so the signal delay through multiplexing circuit 810 is comparable to that of the prior art read decoder 350. However, because read decoder 530-A does not require a predecoder (such as predecoder 310 of prior art LUT 300), signal transmissions from input terminals IN1 through IN4 and IN1_b through IN4_b to the 2-to-1 multiplexers of multiplexing circuit 810 are faster, thereby making the overall operating speed of read decoder 810 faster than the operating speed of prior art read decoder 350.

Circuit 820

Output control circuit 820 includes circuitry for buffering and selecting which signal is applied to the LUT OUT terminal. Output control circuit 820 includes a first inverter 821, a 3-to-1 multiplexer 822, an arithmetic function gate 823 and a second inverter 824. The input terminal of first inverter 821 is connected to the output terminal of multiplexer 817. The output terminal of inverter 821 is connected to the first input terminal of 3-to-1 multiplexer 822, and to the first input terminal of arithmetic function gate 823. Arithmetic function gate 823 includes a second input terminal for receiving, for example, a carry term from an adjacent circuit. In the embodiment shown in FIG. 8, arithmetic function circuit 823 is disclosed as an XOR gate for performing addition functions. In other embodiments, other logic gates or groups of logic gates may be used in place of an XOR gate to facilitate, for example, multiplication functions. The output terminal of arithmetic function gate 823 is connected to a second input terminal of 3-to-1 multiplexer 822. A third input terminal of 3-to-1 multiplexer 822 is connected to receive a data bit from an adjacent circuit (not shown) such as a wide function multiplexer. 3-to-1 multiplexer 822 is configured using memory cells (not shown) to pass one of the output signals from first inverter 821, the output signal from arithmetic function gate 823, or the data bit from an adjacent circuit to the input terminal of second inverter 824. The output terminal of second inverter 824 is connected to the LUT OUT terminal.

Figure 9A:
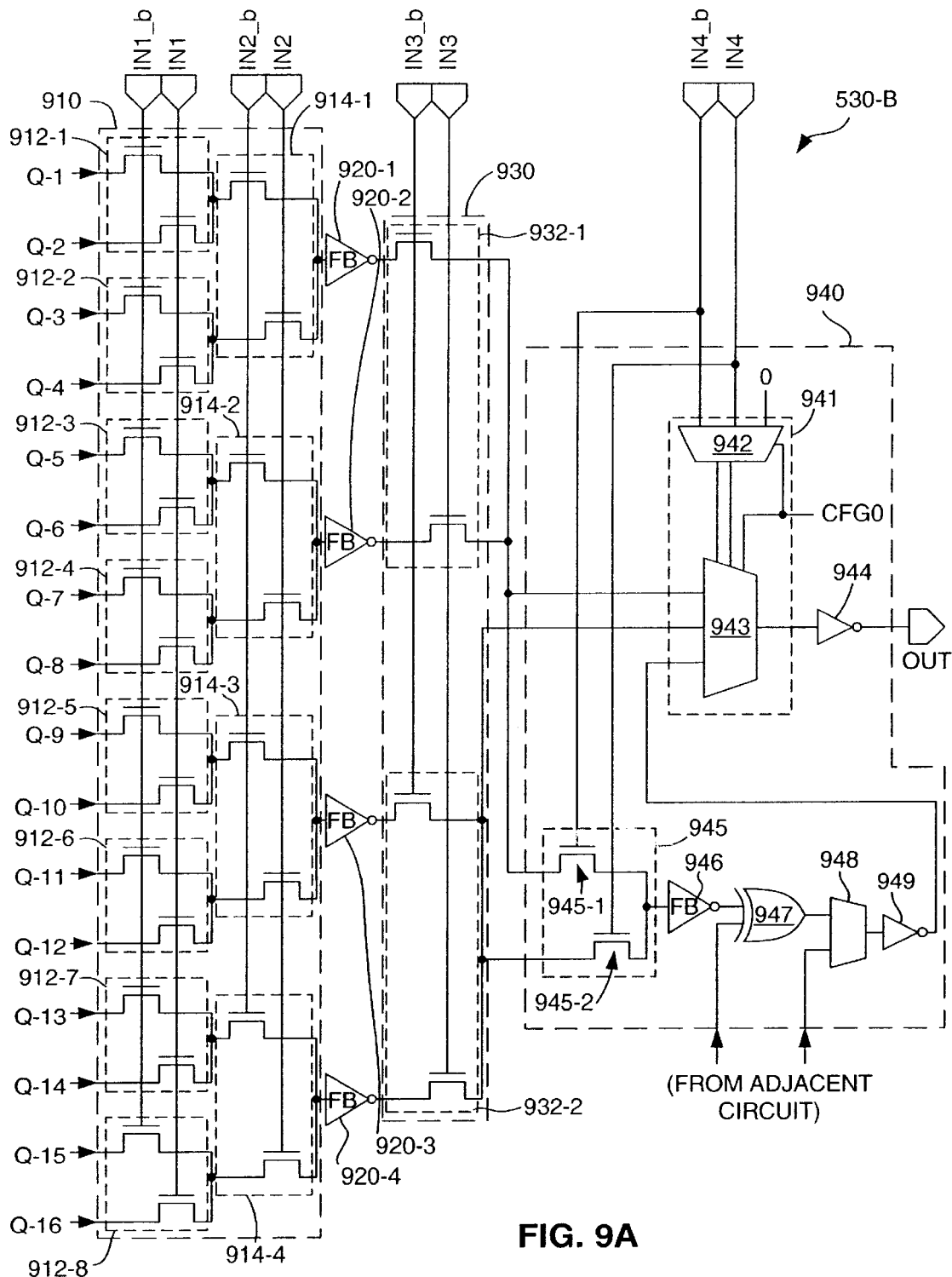
FIG. 9A shows a read decoder circuit of the LUT shown in FIG. 5A in accordance with a second variation of the present invention.

FIG. 9A is a schematic diagram showing read decoder 530-B. Read decoder 530-B includes a first decoder (multiplexing) circuit 910, inverters (buffers) 920-1 through 920-4, a second decoder (multiplexing) circuit 930, and an output control circuit 940. Similar to read decoder 530-A, first decoder circuit 910 and second read decoder 930 include 2-to-1 multiplexers controlled by the input signals received directly from input terminals IN1, IN1_b, IN2, IN2_b, IN3, IN3_b, IN4 and IN4_b. The 2-to-1 multiplexers of first decoder circuit 910 are arranged to provide a 16-to-4 multiplexing function. The multiplexers are arranged in two columns, with the first column being controlled by input signals IN1/IN1_b and the second by signals IN2/IN2_b. The eight multiplexers 912-1 through 912-8 in the first column have input terminals connected to memory circuit output terminals Q-1 through Q-16. The four multiplexers 914-1 through 914-4 in the second column have input terminals connected to output terminals of the first column. Second decoder circuit 930 includes two multiplexers 932-1 and 932-2 that are controlled by input signals on input terminals IN3 and IN3_b. Because first decoder circuit 910 and second decoder circuit 930 comprise 2-to-1 multiplexers, the tradeoff of higher resistance for lower capacitance discussed above that is provided by 2-to-1 multiplexers is also applicable to read decoder 530-B.

Buffers Within a Tree Multiplexer

In accordance with another aspect of the present invention, read decoder 530-B includes inverters (buffers) 920-1 through 920-4 that are connected between first decoder circuit 910 and second decoder circuit 930. For example, inverter 920-1 has an input terminal connected to the output terminal of multiplexer 914-1, and an output terminal connected to that input of multiplexer 932-1 selected by IN3 or IN3-b. Placing inverters (buffers) 920-1 through 920-4 between respective 2-to-1 multiplexers of first decoder circuit 910 and second decoder circuit 930 reduces signal delays through read decoder 530-B because buffers allow the gates in the upstream 2-to-1 multiplexers of first decoder circuit 910 to be much smaller and faster. In addition, these buffers prevent the RC characteristics of read decoder 530-B from becoming excessive by limiting the number of series connected NMOS gates. In the embodiment shown in FIG. 9A, each inverter 920-1 through 920-4 can be implemented by a feedback (FB) inverter circuit that is identical to those shown in FIGS. 7B and 7C. In other embodiments, inverters 920-1 through 920-4 may comprise conventional inverters or buffers. Note that signals IN1 and IN1_b each drive eight transistor gates. Therefore it is desirable that these sixteen transistors be small. Providing inverting buffers 920-1 through 920-4 only one transistor downstream from these sixteen transistors allows these sixteen transistors to be smaller.

Choice Between Flexibility and Speed

Output control circuit 940 includes programmable circuitry for selectively routing data bits either on a high speed output path, or on a relatively slower, high function output path that includes, for example, arithmetic summing logic. The high speed output path is through a 3-to-1 multiplexer 943 and an output inverter 944. The high function output path is through a dynamically controlled 2-to-1 multiplexer 945, a feedback inverter 946 (see FIGS. 7B and 7C), an XOR gate 947, a statically controlled two-input multiplexer 948 and an inverter 949 in addition to multiplexer 943 and inverter 944. The high function output path operates in a manner that is similar to that provided by multiplexer 817 and output control circuit 820 of read decoder 530-A (see FIG. 8). However, instead of being connected from the fourth stage of multiplexers to the output terminal, the output terminal of the high function output path (i.e., the output terminal of second inverter 949) is connected to the two output terminals from the third stage of multiplexers.

Figure 9B:
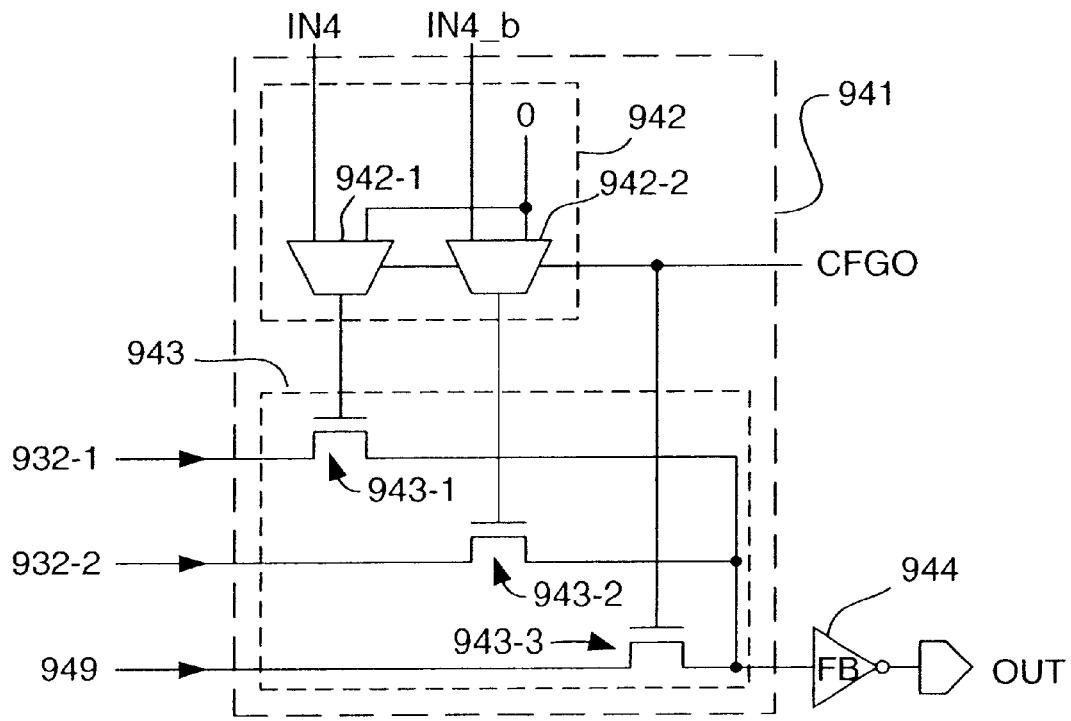
FIG. 9B shows a final decoding circuit of the read decoder shown in FIG. 9A.

FIG. 9B shows path selection circuit 941 in additional detail. Control multiplexer circuit 942 includes two two-input multiplexers 942-1 and 942-2. 3-to-1 multiplexer 943 includes pass transistors 943-1, 943-2 and 943-3 that provide the three paths to output inverter 944. When data bits are to be transmitted on the high speed output path, the configuration signal CFGO is set low, thereby turning off transistor 943-3 from the high function path, and causing multiplexers 942-1 and 942-2 to apply signals IN4 and IN4b to respective pass transistors 943-1 and 943-2. When the high function output path is to be used, the configuration signal CFGO is set high, thereby causing multiplexers 942-1 and 942-2 to apply logic 0 to the gates of pass transistors 943-1 and 943-2. The high configuration signal CFGO turns on pass transistor 943-3, thereby connecting the output terminal of inverter 949 to the input terminal of output inverter 944.

Referring again to FIG. 9A, read decoder 530-B further improves memory read operation speeds by allowing a user to selectively utilize the high speed output path of output control circuit 940. When the high speed output path is used, signal delays are produced by approximately four gates. For example, note that the delay through multiplexers 914-1 through 914-4, 932-1, 932-2 and 943 is minimal because, in each case, the signal passes through a source/drain connection.

Delay Summary

Figure 3D:
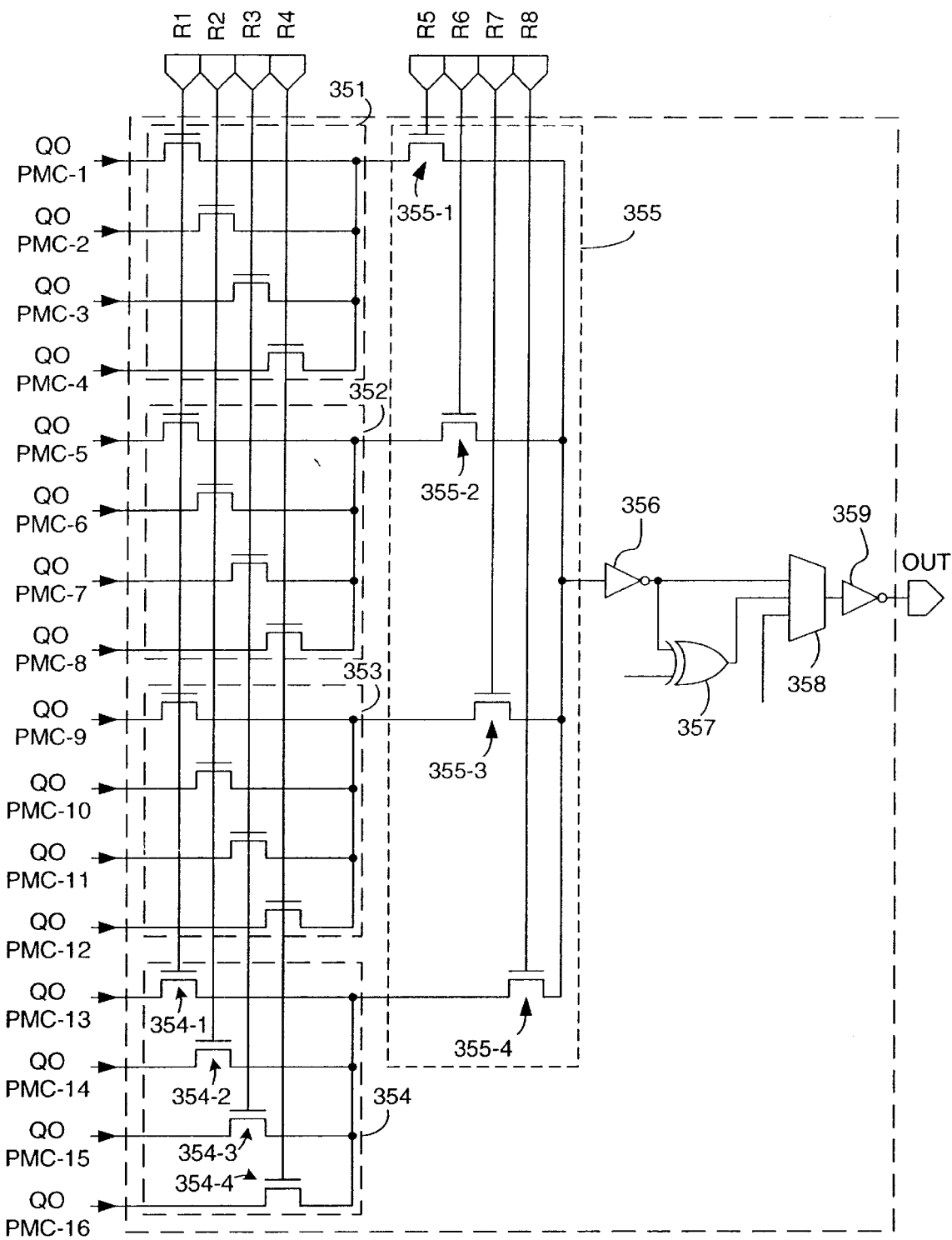
FIG. 3D shows a read decoder circuit of the LUT shown in FIG. 3A.
Figure 3E:
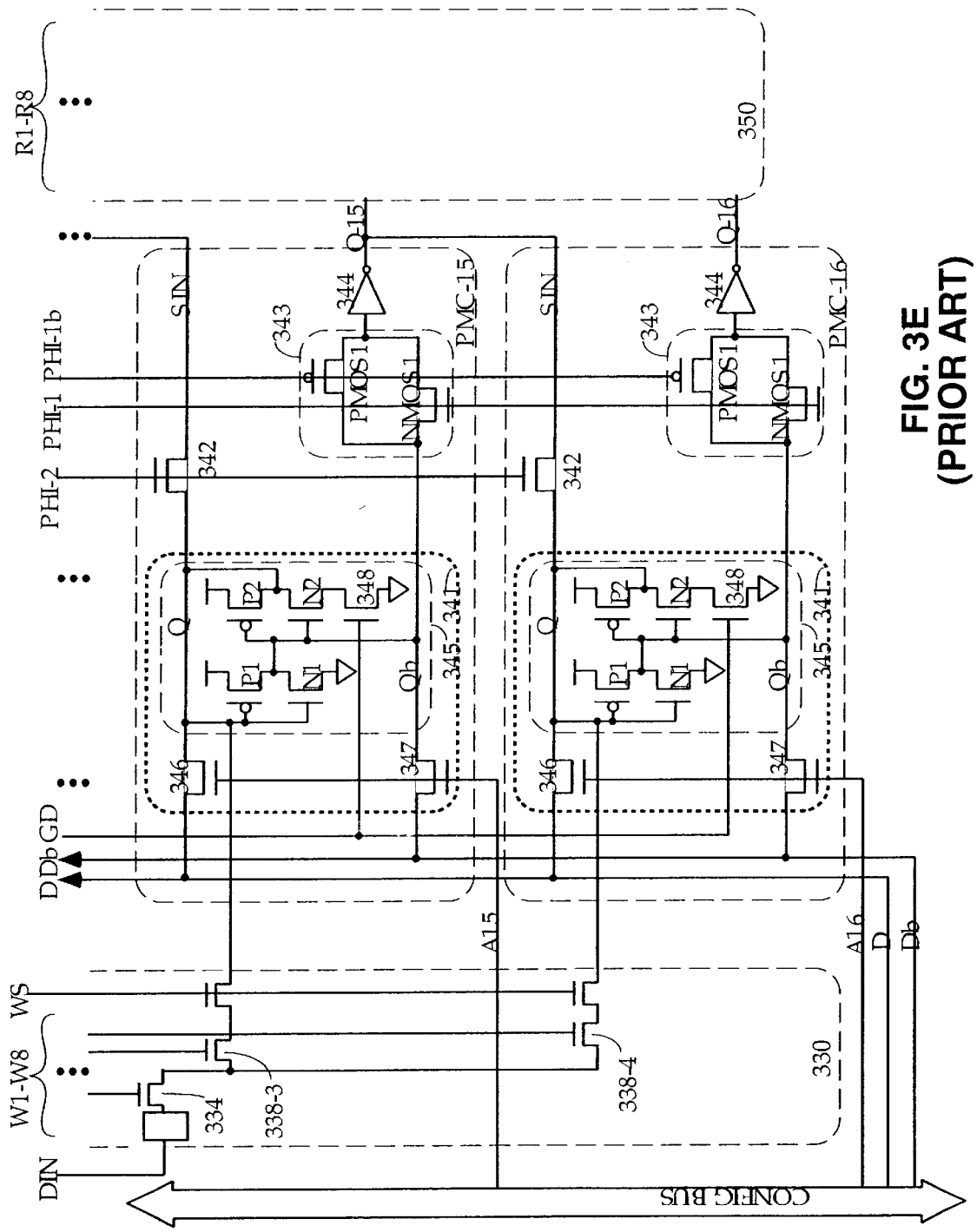
FIG. 3E shows two memory circuits used in the LUT shown in FIG. 3A.

An input signal transmitted to LUT 400 via input terminals IN1_b incurs a first inverter delay (i.e., the inverter shown in FIG. 4 between terminal F1/G1 and the input terminal), a gate/source delay (i.e., caused by any of multiplexers 912-1 through 912-8), second inverter delay (i.e., caused by one of feedback inverters 920-1 through 920-4), and a third inverter delay (i.e., caused by output inverter 944). Therefore, an input signal transmitted to LUT 400 via input terminals IN1_b or IN2_b incurs a delay of approximately four gates. An input signal transmitted to LUT 400 via input terminals IN3_b incurs a three gate delay (i.e., a first inverter delay between terminal F1/G1 and input terminal IN3_b, a gate/source delay associated with multiplexers 932-1 or 932-2), and a second inverter delay caused by output inverter 944). Therefore, read decoder 530-B shown in FIG. 9A facilitates read operations that are significantly faster than prior art read decoder 350 (FIG. 3D).

Additional Embodiments

Although the present invention has been described in considerable detail with reference to certain preferred embodiments, one of ordinary skill would recognize that several variations to the disclosed embodiments are possible.

For example, in CLB 400 of the first embodiment (see FIG. 4) the write address signals are shared between LUTs 420-F and 420-G of CLB 400) to provide either a 32-by-1 or a 16-by-2 dual-port memory. In another embodiment in which each CLB includes eight slices (16 LUTs) formed as four of the structures of FIG. 2 stacked vertically, the write address signals can be shared by two adjacent vertical slices or by two vertical slices in an alternating arrangement (slice 1 with slice 3 and slice 2 with slice 4). In yet another embodiment, write address lines need not be shared at all.

For another example, although the invention has been described using 6T memory cells, many aspects of the invention also apply to 5T memory cells such as described by Hsieh in U.S. Pat. No. 4,750,155.

Figure 9C:
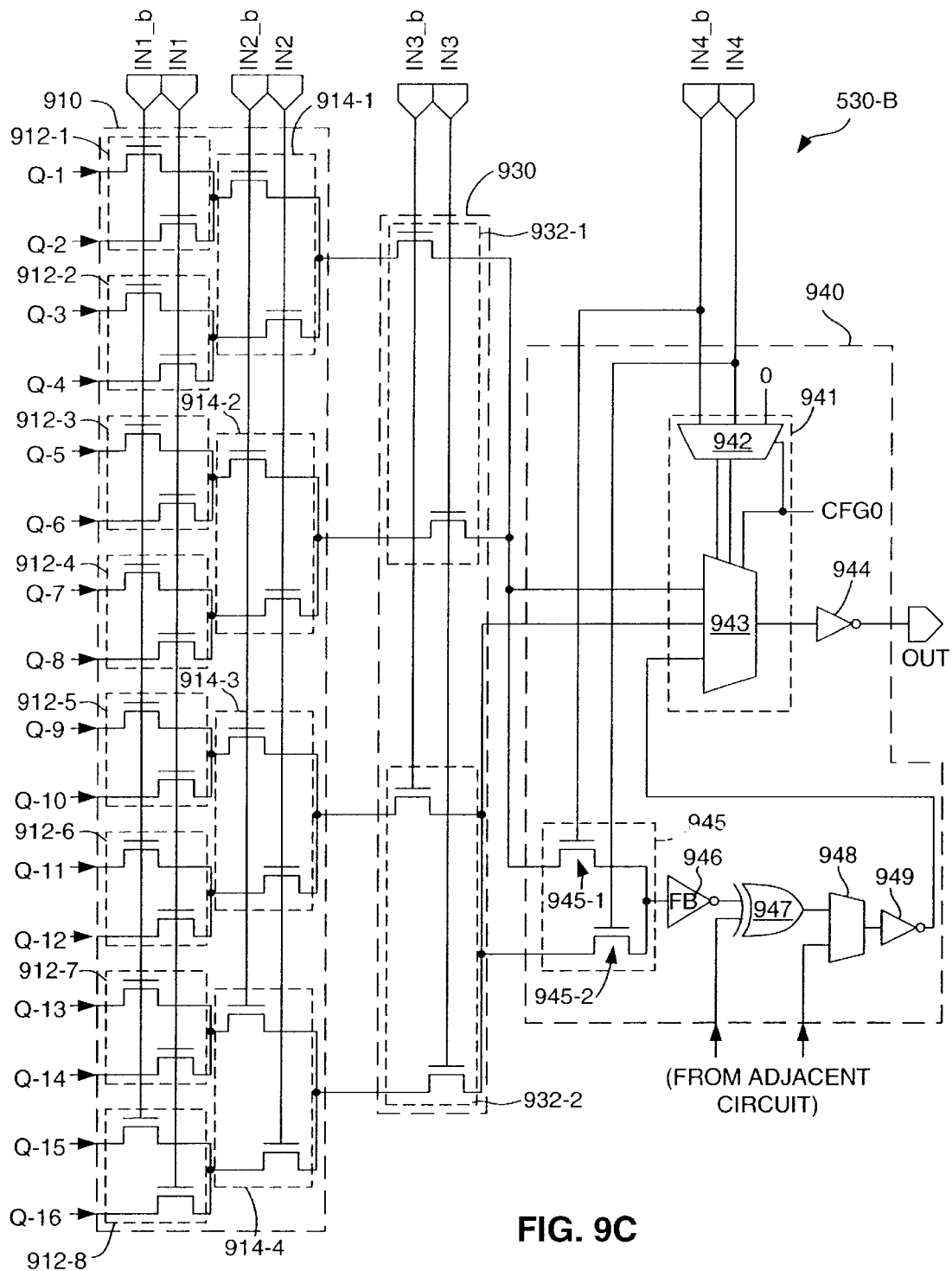
FIG. 9C shows another embodiment of the read decoder circuit of FIG. 9A.

For yet another example, the read decoder circuit of the invention need not include both the buffers and the merged multiplexer structure shown in FIG. 9A. FIG. 9C shows such an alternative embodiment. FIG. 9C is identical to FIG. 9A with the exception that buffers 920-1 through 920-4 of FIG. 9A are not included. Depending upon sizes and other process characteristics, the embodiment of FIG. 9C may be as fast or faster than that of FIG. 9A. The structure of FIG. 9C still achieves the speed improvement over FIG. 8 resulting from merging multiplexer 822 with the last stage 817 of the multiplexer tree.

Figure 10:
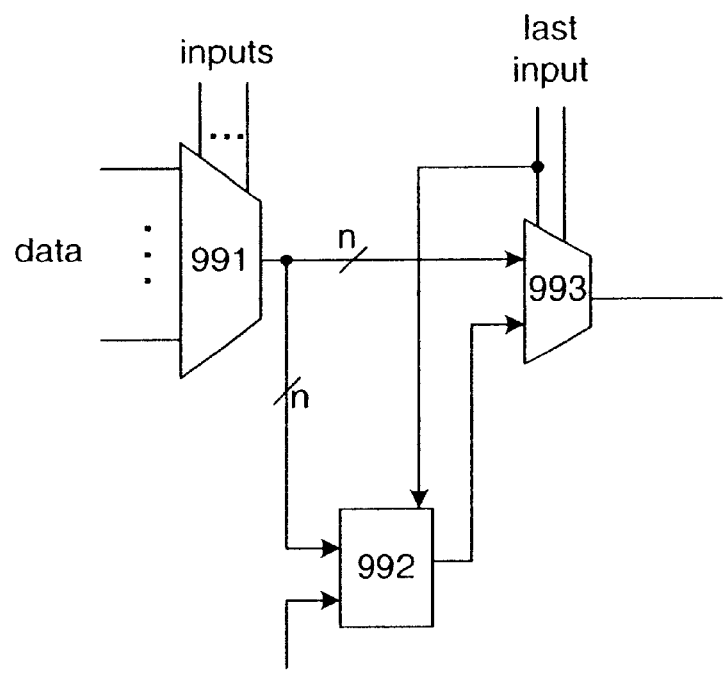
FIG. 10 shows an overview of the inventive read decoder structure.

FIG. 10 shows an overview of the inventive read decoder structure. Multiplexer structure 991 represents a multiplexer structure such as shown in detail in the left part of FIG. 8, 9A or 9C. A plurality n of output data signals from a next-to-last stage is applied to a select multiplexer 993 along with a modified set of input signals from a data modification circuit 992. This data modification circuit may comprise the combinatorial circuit illustrated in the lower right portion of FIG. 9A or 9C, or alternatively may include a register for storing values generated by multiplexer structure 991. In either case, select multiplexer 993 performs the combined function of acting as the last stage of a larger multiplexer structure and selecting from an alternative signal, thus reducing time delay through the full multiplexer structure.

In addition to the above examples, one of ordinary skill would recognize that other variations to the disclosed embodiments are possible. Therefore, the spirit and scope of the appended claims should not be limited to the description of the preferred embodiments contained herein.

We claim:

1. A lookup table comprising:
    a plurality of memory circuits, each having a memory circuit output terminal providing a memory circuit output signal;
    a read decoder tree having at least two stages of multiplexers separated by a stage of buffers comprising:
        a first stage of multiplexers comprising a plurality of first stage multiplexers each first stage multiplexer receiving as input signals at least two of the memory circuit output signals and providing a first stage multiplexer output signal;
        a second stage of multiplexers comprising at least one second stage multiplexer having a plurality of input terminals for receiving second stage multiplexer input signals; and
        a buffer stage comprising a plurality of buffers, each buffer having an input terminal connected to receive one of the first stage multiplexer output signals and having an output terminal connected to provide one of the second stage multiplexer input signals.

2. A lookup table with high speed read decoder comprising:
    a plurality of memory cells;
    for each of the memory cells, a dynamic latch connected to an output terminal of the memory cell; and
    a read decode tree having a plurality of data terminals, each connected to an output terminal of one of the dynamic latches;
    whereby the dynamic latches can be held in a transparent state such that the value stored in the memory cell is present at the output terminal of the dynamic latch and available for reading by the read decode tree.

3. A lookup table (LUT) for a programmable logic device, the programmable logic device including interconnect resources for transmitting a plurality of input signals, the LUT comprising:
    a plurality of memory circuits, each memory circuit having a memory cell for storing a data signal, and an output terminal for supplying the data signal during a memory read operation; and
    a read decoder connected to the output terminals of the plurality of memory circuits, wherein the read decoder includes:
        a first multiplexing circuit including a first multiplexer for passing a first data signal from a first memory cell to an output terminal in response to a first input signal of the plurality of input signals, and a second multiplexer for passing a second data signal from a second memory cell to an output terminal in response to the first input signal;
        a first buffer having an input terminal connected to the output terminal of the first multiplexer, the first buffer also having an output terminal;
        a second buffer having an input terminal connected to the output terminal of the second multiplexer, the second buffer also having an output terminal; and
        a second multiplexing circuit including a third multiplexer having a first input terminal connected to the output terminal of the first buffer, and a second input terminal connected to the output terminal of the second buffer, wherein the third multiplexer passes one of the first data signal, the second data signal and a third data signal in response to a second input signal of the plurality of input signals.

4. The LUT according to claim 3, wherein the first buffer comprises:
   an inverter having an input terminal connected to the output terminal of the first multiplexer and an output terminal;
   a feedback transistor having a first terminal connected to a first voltage source, a second terminal connected to the input terminal of the inverter, and a gate connected to the output terminal of the inverter; and
   a bias transistor having a first terminal connected to the input terminal of the inverter, a second terminal connected to a second voltage source, and a gate connected to receive a shutoff signal.

5. The LUT according to claim 3, wherein the first buffer comprises:
   an inverter having an input terminal connected to the second terminal of the first multiplexer and an output terminal;
   a first feedback transistor having a first terminal connected to the input terminal of the inverter, a gate connected to the output terminal of the inverter, and a second terminal; and
   a second feedback transistor having a first terminal connected to a first voltage source, a second terminal connected to the second terminal of the first feedback transistor, and a gate connected to a second voltage source.

6. The LUT according to claim 3,
   wherein the memory cell of each memory circuit further comprises a latch including a first terminal for receiving the non-inverted data signal, and a second terminal for receiving the inverted data signal, and
   wherein each memory circuit further comprises:
      a latching transistor having a first terminal connected to the second terminal of the latch, the latching transistor also including a second terminal; and
      a feedback inverter circuit having an input terminal connected to the second terminal of the latching transistor and an output terminal connected to the output terminal of the memory circuit.

7. The LUT according to claim 3,
   wherein the first input signal includes a non-inverted signal and an inverted signal, and
   wherein the first multiplexer comprises a first pass transistor having a gate connected to receive the non-inverted signal, and a second pass transistor having a gate connected to receive the inverted signal.

8. The LUT according to claim 7, wherein the first multiplexing circuit further comprises:
   a fourth multiplexer having first and second input terminals connected to respective output terminals of first and second memory circuits, and an output terminal connected to the first pass transistor of the first multiplexer; and
   a fifth multiplexer having first and second input terminals connected to respective output terminals of third and fourth memory circuits, and an output terminal connected to the second pass transistor of the first multiplexer;
   wherein the fourth and fifth multiplexers are controlled by a third input signal of the plurality of input signals.

9. A lookup table (LUT) for a programmable logic device, the programmable logic device including interconnect resources for transmitting a plurality of input signals, the LUT comprising:
   a memory block for storing a plurality of data signals and for applying the stored data signals to a plurality of first terminals;
   first multiplexing means for selectively passing a first group of said plurality of data signals from the first terminals to a plurality of second terminals in response to one or more of said plurality of input signals;
   a plurality of buffers, each having an input terminal connected to one of the plurality of second terminals of the first multiplexing means, each of the plurality of buffers having an output terminal; and
   second multiplexing means for selectively passing a second group of said data signals from the output terminals of the plurality of buffers to a plurality of third terminals in response to one or more of said plurality of input signals.

10. The LUT according to claim 9, wherein the first multiplexing means comprises a first plurality of 2-to-1 multiplexers arranged in a first column and having input terminals connected to the plurality of first terminals, and a second plurality of 2-to-1 multiplexers arranged in a second column and having input terminals connected to output terminals of the first plurality of 2-to-1 multiplexers.

11. The LUT according to claim 9, wherein each of the plurality of buffers comprises:
   an inverter having an input terminal connected to an associated one of the plurality of second terminals of the first multiplexing means, the inverter also having an output terminal;
   a feedback transistor having a first terminal connected to a first voltage source, a second terminal connected to the input terminal of the inverter, and a gate connected to the output terminal of the inverter; and
   a bias transistor having a first terminal connected to the input terminal of the inverter, a second terminal connected to a second voltage source, and a gate connected to receive a shutoff signal.

12. The LUT according to claim 9, wherein each of the plurality of buffers comprises:
   an inverter having an input terminal connected to an associated one of the plurality of second terminals of the first multiplexing means, the inverter also having an output terminal;
   a first feedback transistor having a first terminal connected to the input terminal of the inverter, a gate connected to the output terminal of the inverter, and a second terminal; and
   a second feedback transistor having a first terminal connected to a first voltage source, a second terminal connected to the second terminal of the first feedback transistor, and a gate connected to a second voltage source.

13. The LUT according to claim 9, wherein the second multiplexing means comprises first and second 2-to-1 multiplexers having input terminals connected to the output terminals of the plurality of buffers.

14. A lookup table (LUT) for a programmable logic device, the programmable logic device including interconnect resources for transmitting a plurality of input signals, the LUT comprising:
   a plurality of memory circuits for storing data signals;

a decoding circuit having input terminals respectively connected to the plurality of memory circuits, the decoding circuit including a plurality of multiplexers arranged to selectively pass first and second data signals from the input terminals to first and second output terminals in response to a group of said plurality of input signals; and an output control circuit comprising:

an output control multiplexer having first and second input terminals respectively connected to the first and second output terminals of the decoding circuit, the output control multiplexer being controlled by a first input signal of said plurality of input signals to selectively pass a selected data signal of the first and second data signals to an output terminal of the output control circuit;

a logic circuit connected to the output terminal of the output control multiplexer for generating a third asynchronous data signal in response to the selected data signal passed from the output control multiplexer; and a path selection circuit having a first input terminal connected to the first output terminal of the decoding circuit, a second input terminal connected to the second output terminal of the decoding circuit, and a third input terminal connected to receive the third asynchronous data signal from the logic circuit.

15. The LUT according to claim 14, wherein the decoding circuit comprises:

a first multiplexing circuit including a first multiplexer for passing a first data signal from a first memory circuit of the plurality of memory circuits to an output terminal in response to a first input signal of the plurality of input signals, and a second multiplexer for passing a second data signal from a second memory circuit of the plurality of memory circuits to an output terminal in response to the first input signal;

a first buffer having an input terminal connected to the output terminal of the first multiplexer, the first buffer also having an output terminal;

a second buffer having an input terminal connected to the output terminal of the second multiplexer, the second buffer also having an output terminal; and a second multiplexing circuit including a third multiplexer having a first input terminal connected to the output terminal of the first buffer, and a second input terminal connected to the output terminal of the second buffer, wherein the third multiplexer passes one of the first data signal, the second data signal and a third data signal in response to a second input signal of the plurality of input signals.

16. The LUT according to claim 15, wherein the first buffer comprises:

an inverter having an input terminal connected to the output terminal of the first multiplexer and an output terminal;

a feedback transistor having a first terminal connected to a first voltage source, a second terminal connected to the input terminal of the inverter, and a gate connected to the output terminal of the inverter; and a bias transistor having a first terminal connected to the input terminal of the inverter, a second terminal connected to a second voltage source, and a gate connected to receive a shutoff signal.

17. The LUT according to claim 15, wherein the first buffer comprises:

an inverter having an input terminal connected to the second terminal of the first multiplexer and an output terminal;

a first feedback transistor having a first terminal connected to the input terminal of the inverter, a gate connected to the output terminal of the inverter, and a second terminal; and a second feedback transistor having a first terminal connected to a first voltage source, a second terminal connected to second terminal of the first feedback transistor, and a gate connected to a second voltage source.

18. The LUT according to claim 14, wherein the first input signal includes a non-inverted signal and an inverted signal, and wherein the output control multiplexer comprises a first pass transistor having a gate connected to receive the non-inverted signal, and a second pass transistor having a gate connected to receive the inverted signal.

19. The LUT according to claim 18, wherein the logic circuit comprises a buffer connected to the first and second pass transistors, and an arithmetic summing circuit connected to an output terminal of the buffer.

20. The LUT according to claim 19, wherein the logic circuit further comprises a two input multiplexer having an input terminal connected to an output terminal of the arithmetic summing circuit, and an inverter having an input terminal connected to an output terminal of the two input multiplexer.

21. The LUT according to claim 14, wherein the path selection circuit comprises:

a control multiplexer circuit having an input terminal connected to receive the first input signal, a control terminal connected to receive a global control signal, and an output terminal; and a 3-to-1 multiplexer connected to the first, second and third input terminals of the path selection circuit, and having a select terminal connected to the output terminal of the control multiplexer circuit and to receive the global control signal.

* * * * *